United States Patent [19]
Ishizaki et al.

[11] Patent Number: 5,473,289
[45] Date of Patent: Dec. 5, 1995

[54] TEMPERATURE COMPENSATED CRYSTAL OSCILLATOR

[75] Inventors: Toshio Ishizaki, Kobe; Yuki Satoh, Neyagawa; Koji Hashimoto, Kobe, all of Japan

[73] Assignee: Matsushita Electric Industrial Co., Ltd., Osaka, Japan

[21] Appl. No.: 186,759

[22] Filed: Jan. 25, 1994

[30] Foreign Application Priority Data

Jan. 25, 1993 [JP] Japan .................................. 5-010124

[51] Int. Cl.⁶ .............................. H03B 5/32; H03L 1/02
[52] U.S. Cl. ...................... 331/176; 331/158; 331/116 R; 331/66; 331/177 V
[58] Field of Search ........................ 331/66, 176, 116 R, 331/116 FE, 177 V, 158

[56] References Cited

U.S. PATENT DOCUMENTS

| | | | |
|---|---|---|---|
| 3,821,665 | 6/1974 | Irwin et al. | 331/66 |
| 4,254,382 | 3/1981 | Keller et al. | 331/116 R |
| 4,492,933 | 1/1985 | Grieco | 331/66 |
| 4,532,468 | 7/1985 | Nishida et al. | 331/176 X |
| 4,560,959 | 12/1985 | Rokos et al. | 331/176 |
| 4,746,879 | 5/1988 | Ma et al. | 331/44 |
| 4,851,791 | 7/1989 | Marotel | 331/158 |
| 4,851,792 | 7/1989 | Ochiai et al. | 331/176 |
| 5,004,988 | 4/1991 | Ueno et al. | 331/116 R |
| 5,041,799 | 8/1991 | Pirez | 331/44 |

FOREIGN PATENT DOCUMENTS

| | | | |
|---|---|---|---|
| 0039215 | 11/1981 | European Pat. Off. | |
| 1565566 | 5/1969 | France | |
| 0104105 | 8/1980 | Japan | 331/176 |
| 55-125702 | 9/1980 | Japan | |
| 56-68002 | 6/1981 | Japan | |
| 1-265708 | 10/1989 | Japan | |
| 2-203605 | 8/1990 | Japan | |
| 3-126304 | 5/1991 | Japan | |
| 5-35340 | 2/1993 | Japan | |
| 1200863 | 8/1970 | United Kingdom | |
| 1224165 | 3/1971 | United Kingdom | |
| 2121629 | 12/1983 | United Kingdom | |

OTHER PUBLICATIONS

European Search Report 94101044.9 dated Aug. 9, 1994.
T. Hara et al., "A Digitally Compensated TCXO Using A Single Chip LSI", *IEEE-41st Annual Frequency Control Symposium-1987*, pp. 435–438.
European Search Report (94 10 1044) dated Apr. 27, 1994.
U.S. application Ser. No. 163,590 dated Mar. 3, 1988.

*Primary Examiner*—Robert J. Pascal
*Assistant Examiner*—Arnold Kinkead
*Attorney, Agent, or Firm*—Ratner & Prestia

[57] ABSTRACT

A temperature compensated crystal oscillator including: an oscillation circuit having a quartz crystal resonator and a control terminal, for providing an oscillating signal determined by the quartz crystal resonator and a control signal, the control signal being applied to the control terminal; a temperature detecting circuit for detecting an operation temperature and outputting a temperature signal based on the operation temperature; and a control signal generating circuit for receiving the temperature signal from the temperature detecting circuit, generating the control signal based on a characteristic curve, and outputting the control signal to the control terminal; the characteristic curve essentially consisting of a plurality of straight lines and being an approximation of an ideal control curve in a predetermined operation temperature range including the operation temperature, the ideal control curve having a relationship between the control signal and the temperature signal for ideally compensating a fluctuation of a frequency of the oscillating signal against changes of the operation temperature, the predetermined operation temperature range being divided into temperature ranges, each of the plurality of straight lines corresponding to one of the divided temperature ranges.

21 Claims, 19 Drawing Sheets

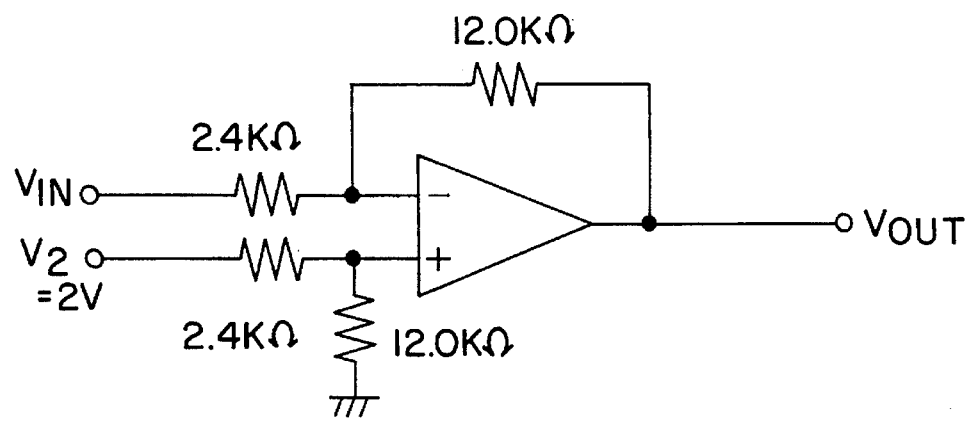
F I G. 18(a)
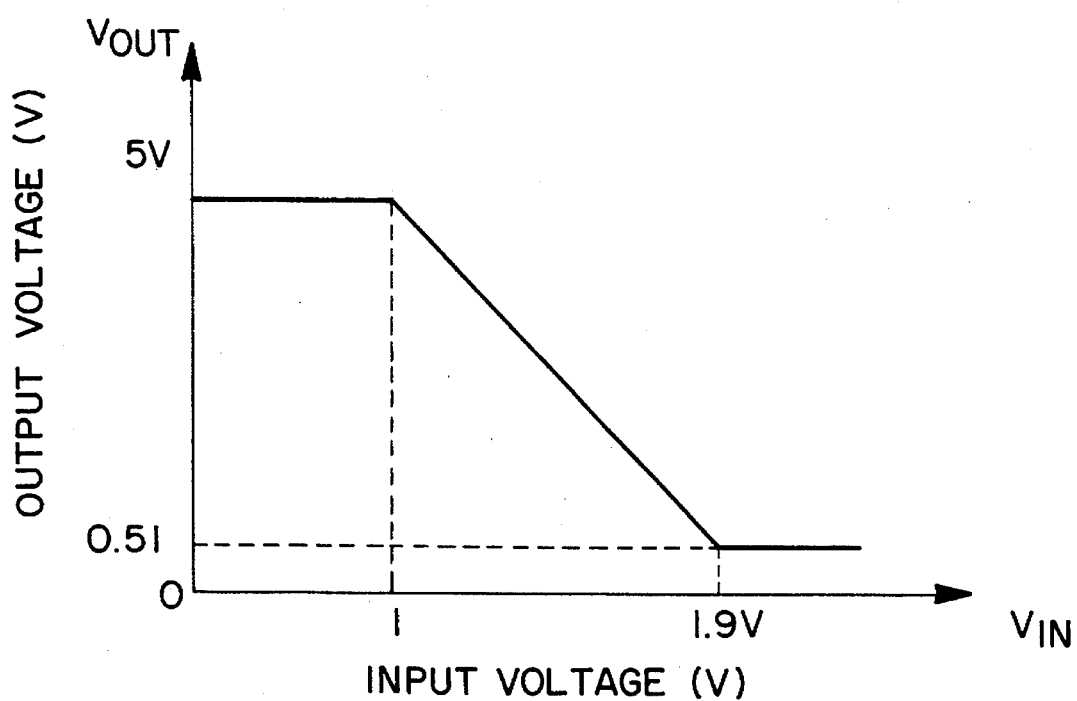
F I G. 18(b)

TEMPERATURE COMPENSATED CRYSTAL OSCILLATOR

BACKGROUND OF THE INVENTION

1. Field of the Invention

The present invention relates to a crystal oscillator, and more particularly to a temperature compensated crystal oscillator used as a reference frequency oscillator in a mobile communication device (such as a car telephone, a portable telephone, and a cordless telephone), a satellite communication device, and the like.

2. Description of the Related Art

In recent years, there has been increasing demand for a crystal oscillator used for oscillating a reference frequency in a mobile communication device (such as a car telephone, a portable telephone, and a cordless telephone, and often called a cellular telephone), a satellite communication device, and the like, as such communication devices have been become more and more prevalent.

A crystal oscillator to be used for oscillating a reference frequency is required to have as small fluctuation of the oscillating frequency as possible against changes of temperature. In the case of use in a terminal for an analog portable telephone system used in North America, for example, the fluctuation of the oscillating frequency is required to be within a range of ±2.5 p.p.m. over a temperature range of −30° C. to +75° C. For use in a terminal for a narrow-band TDMA type digital portable telephone system, the fluctuation of the oscillating frequency is required to be within a range of ±1.5 p.p.m. over a temperature range of −20° C. to +85° C. For use in a terminal for a large capacity analog portable telephone system used in Japan, the fluctuation of the oscillating frequency is required to be within a range of ±1.0 .p.p.m. over a temperature range of −20° C. to +85° C. Moreover, such crystal oscillators used in a portable telephone must satisfy other requirements, e.g. miniaturization of the device and reduction of the manufacturing cost, which are particularly eminent requirements for a crystal oscillator used in a cellular telephone. Therefore, a crystal oscillator suitable for such use is strongly needed.

The oscillating frequency-temperature characteristics of a crystal oscillator depend directly on the resonant frequency-temperature characteristics of a quartz crystal resonator used in the crystal oscillator. Therefore, when the oscillating frequency is required to be highly stable over a wide temperature range, a temperature compensation circuit is usually required. There are two known methods for temperature compensation using a temperature compensation circuit. One is an analog temperature compensation method in which change in the impedance of the quartz crystal resonator is compensated by using a temperature sensitive element such as a thermistor. The other is a digital temperature compensation method in which a voltage for compensating the temperature characteristics of the quartz crystal resonator (which is used for the oscillation purpose) in accordance with compensation data prestored in a memory is applied to a variable capacitor, based on information obtained from a separately incorporated temperature detecting quartz crystal resonator.

Hereinafter, conventional temperature compensated crystal oscillators will be described with reference to the accompanying drawings. FIG. 19 is a block diagram showing a conventional analog-type temperature compensated crystal oscillator. As is shown in FIG. 19, a quartz crystal resonator 11 and a temperature compensation circuit 111 are connected in series to an oscillation circuit 12 having an output terminal 13. The temperature compensation circuit 111 includes a circuit portion in which a thermistor 112, a resistor 113, and a capacitor 114 are connected in parallel as well as a circuit portion in which a capacitor 117 is connected in parallel to a thermistor 115 and a resistor 116 that are connected in series. When the ambient temperature changes, the resistance of each of the thermistors 112 and 115 varies, whereby the reactance of the impedance of the whole temperature compensation circuit 111 is varied. Therefore, in the case where the respective values of the thermistors 112, 115, resistors 113, 116, and capacitors 114, 117 are determined so as to compensate the fluctuation of the oscillating frequency based on the changes of impedance, it becomes possible to stabilize against temperature changes the oscillating frequency of the crystal oscillator. Examples of such conventional crystal oscillators are disclosed in Japanese Laid-Open Patent Publication Nos. 55-125702, 56-68002, etc.

FIG. 20 is a block diagram showing a conventional digital-type temperature compensated crystal oscillator. As is shown in FIG. 20, the crystal oscillator includes a digitally controlled crystal oscillator 120, a temperature sensor 121, an A/D (Analog/Digital) convertor 122, and a memory 123. The digitally controlled crystal oscillator 120 has a quartz crystal resonator 11, an oscillation circuit 12, and a variable reactance circuit 124. This crystal oscillator operates as follows: The temperature sensor 121 detects a change in the ambient temperature. The A/D convertor 122 converts the change in the ambient temperature to a digital signal. The compensation data prestored in the memory 123 is read out in accordance with the digital signal. The reactance value of the variable reactance circuit 124 is changed based on the compensation data that has been read out, whereby the oscillating frequency of the digitally controlled crystal oscillator 120 is stabilized against changes in temperature. The compensation data prestored in the memory 123 is in the form of, for example, a table of 8 bits (corresponding to 256 points in temperature) by 7 bits (corresponding to 128 control amounts), as is described in 41st Annual Frequency Control Symposium, 1987, p. 435, 'A Digitally Compensated TCXO Using A Single Chip LSI': by T. Hara, T. Kudo, S. Uriya, H. Saita, S. Ogou, and Y. Katsuta.

However, each of the above-mentioned conventional analog-type temperature compensated crystal oscillator and conventional digital-type temperature compensated crystal oscillator has the following inherent problems.

An analog-type crystal oscillator in which thermistors are used has the following problems. Since a conventional analog compensation method can compensate only some specific fluctuation patterns of the resonant frequency-temperature characteristics of quartz crystal resonators, it is impossible to compensate all the kinds of the fluctuation patterns of the resonant frequency-temperature characteristics of the quartz crystal resonator, thus resulting in poor temperature compensation accuracy. Moreover, the thermistors have a large variation in their characteristics. Therefore, it is required to select quartz crystal resonators having minimum fluctuation of resonant frequency-temperature characteristics. Also, the conventional analog compensation method requires rather complicated calibration. As a result, conventional analog-type crystal oscillators require large production costs.

More specifically, the resonant frequency-temperature characteristics depend largely on the cut angle of the individual quartz crystal resonator. Commercially available quartz crystal resonators have a variation in cut angles of approximately ±5 minutes. Such variation in cut angles, however, results in too large a fluctuation in the resonant frequency-temperature characteristics of the crystal vibrators; an analog-type temperature compensated crystal oscillator having such a quartz crystal resonator is not capable of completely compensating changes in temperature. Therefore, it is required to select, from commercially available quartz crystal resonators, those with a cut angle variation of approximately ±1 minutes, which results in an increase in the production cost. Moreover, such devices as thermistors are not suitable for being integrated into ICs (Integrated Circuits), which leads to the problem that miniaturization of the crystal oscillator can be difficult.

On the other hand, a digital-type temperature compensated crystal oscillator corrects the frequency with respect to each sampling point in temperature, which requires compensation data consisting of a table of 8 bits by 7 bits, for example. The compensation data must be stored in a PROM (Programmable Read Only Memory). Therefore, digital-type temperature compensated crystal oscillators require a great amount of time and trouble in the fabrication thereof, resulting in high prices of the resultant products.

SUMMARY OF THE INVENTION

The temperature compensated crystal oscillator of the present invention includes: oscillation means including a quartz crystal resonator and a control terminal, for providing an oscillating signal determined by the quartz crystal resonator and a control signal, the control signal being applied to the control terminal; temperature detecting means for detecting an operation temperature and outputting a temperature signal based on the operation temperature; and control signal generating means for receiving the temperature signal from the temperature detecting means, generating the control signal based on a characteristic curve, and outputting the control signal to the control terminal; the characteristic curve essentially consisting of a plurality of straight lines and being an approximation of an ideal control curve in a predetermined operation temperature range including the operation temperature, the ideal control curve having a relationship between the control signal and the temperature signal for ideally compensating a fluctuation of a frequency of the oscillating signal against changes of the operation temperature, the predetermined operation temperature range being divided into temperature ranges, each of the plurality of straight lines corresponding to one of divided temperature ranges.

In one embodiment of the invention, the characteristic curve is selected so as to minimize a maximum value of frequency fluctuation resulting from deviation from the ideal control curve over the operation temperature range.

In another embodiment of the invention, each of the plurality of straight lines conforms to the ideal control curve at both ends of each divided temperature ranges so that no frequency fluctuation occurs at both the ends.

In still another embodiment of the invention, the characteristic curve consists of five straight lines.

In still another embodiment of the invention, the characteristic curve consists of four straight lines.

In still another embodiment of the invention, the characteristic curve consists of three straight lines.

In still another embodiment of the invention, the temperature detecting means is a circuit including a resistor connected in series to a plurality of diodes connected in series to one another, a connection point between the resistor and the diodes defining an output terminal for outputting the temperature signal, and a DC current being applied to the circuit.

In still another embodiment of the invention, the control signal generating means includes a plurality of voltage function generating circuits for outputting the control signal which is linearly varied in accordance with the temperature signal and switching means for switching between the voltage function generating circuits, each of the voltage function generating circuits being operated in corresponding one of the divided temperature ranges.

In still another embodiment of the invention, the control signal generating means includes: a plurality of voltage generating circuits each having input-output characteristics for linearly varying output voltage from a first predetermined voltage to a second predetermined voltage in accordance with input voltage within an input voltage range corresponding to a predetermined one of the divided temperature ranges and for maintaining the output voltage at one of the first predetermined voltage and the second predetermined voltage in an input voltage range corresponding to the other divided temperature ranges; and a voltage adder for adding the output voltages of all the voltage function generating circuits with one another.

In still another embodiment of the invention, the control signal generating means includes: a number (n+1) of voltage function generating circuits having input-output characteristics such that, in a predetermined input voltage range corresponding to two adjoining ones of the divided temperature ranges, output voltage linearly increases from zero to a predetermined maximum value in accordance with input voltage in a first one of the two adjoining temperature ranges and that the output voltage linearly decreases from the maximum value to zero in accordance with the input voltage in the other one of the two adjoining temperature ranges and further that the output voltage is zero in an input voltage range other than the input voltage range corresponding to the two adjoining temperature ranges; and a voltage adder for adding the output voltages of all the voltage function generating circuits with one another, wherein the output voltage of each voltage function generating circuit varies based on the following relationship: as the output voltage of an $i_{th}$ voltage function generating circuit increases from zero to a maximum value, the output voltage of an $(i-1)_{th}$ voltage function generating circuit decreases from a maximum value to zero; and as the output voltage of an $i_{th}$ voltage function generating circuit decreases from a maximum value to zero, the output voltage of an $(i+1)_{th}$ voltage function generating circuit increases from zero to a maximum value, wherein n is an integer of 2 or more representing the number of the temperature ranges; and i is an integer in the range of 2 to n.

In still another embodiment of the invention, the output voltage of the $i_{th}$ voltage function generating circuit increasing from zero to the maximum value in the first one of the two adjoining temperature ranges is generated by a single-section voltage function generating circuit composed mainly of at least one operational amplifier, and wherein the output voltage of the single-section voltage function generating circuit composed mainly of the at least one operational amplifier is inverted to be utilized as the output voltage of the $(i-1)_{th}$ voltage function generating circuit decreasing from the maximum value to zero in the other one of the two adjoining temperature ranges.

In still another embodiment of the invention, the first voltage function generating circuit is a single-section voltage function generating circuit composed mainly of operational amplifiers for generating output voltage decreasing from a maximum value to zero in accordance with the input voltage.

In still another embodiment of the invention, the $(n+1)_{th}$ voltage function generating circuit is a single-section voltage function generating circuit composed mainly of operational amplifiers for generating output voltage increasing from zero to a maximum value.

In still another embodiment of the invention, the maximum values of the output voltages of the voltage function generating circuits are prescribed at the same value, and wherein such a desired control signal is generated by adjusting amplitude of an operational amplifier inserted between each voltage function generating circuit and the voltage adder.

In still another embodiment of the invention, the voltage function generating circuits are composed mainly of at least one operational amplifier, and wherein the maximum output voltage of each voltage function generating circuit is defined by utilizing saturation characteristics of the output voltage of the operational amplifiers.

A temperature compensated crystal oscillator according to the present invention requires only a small number of temperature sampling points, e.g. 3 to 5 points at which the temperature compensated crystal oscillator is calibrated so as to restrain the fluctuation of the oscillating frequency to 1 or 2 p.p.m. or less over a temperature range extending approximately 100° C. Moreover, the temperature compensated crystal oscillator can be calibrated independently at each temperature sampling point, thereby greatly facilitating the calibration of temperature compensation. Therefore, the temperature compensated crystal oscillator of the present invention can have high accuracy at a relatively low production cost. Moreover, the temperature compensated crystal oscillator can be miniaturized because it can be composed only of devices that are suitable for integration into ICs.

Thus, the invention described herein makes possible an advantage of providing a compact and low-cost temperature compensated crystal oscillator having high accuracy, which can suitably be used in a cellular telephone, a cordless telephone, and the like.

This and other advantages of the present invention will become apparent to those skilled in the art upon reading and understanding the following detailed description with reference to the accompanying figures.

BRIEF DESCRIPTION OF THE DRAWINGS

FIG. 18(a) is a specific circuit diagram showing a voltage function generating circuit according to the fourth example of the present invention.

FIG. 18(b) is a diagram showing the relationship between the input voltage and output voltage of the circuit shown in FIG. 18(a).

DESCRIPTION OF THE PREFERRED EMBODIMENTS

Hereinafter, the present invention will be described by way of examples, with reference to the accompanying drawings. Like components are indicated by like numerals throughout the examples.

Example 1

Figure 1:
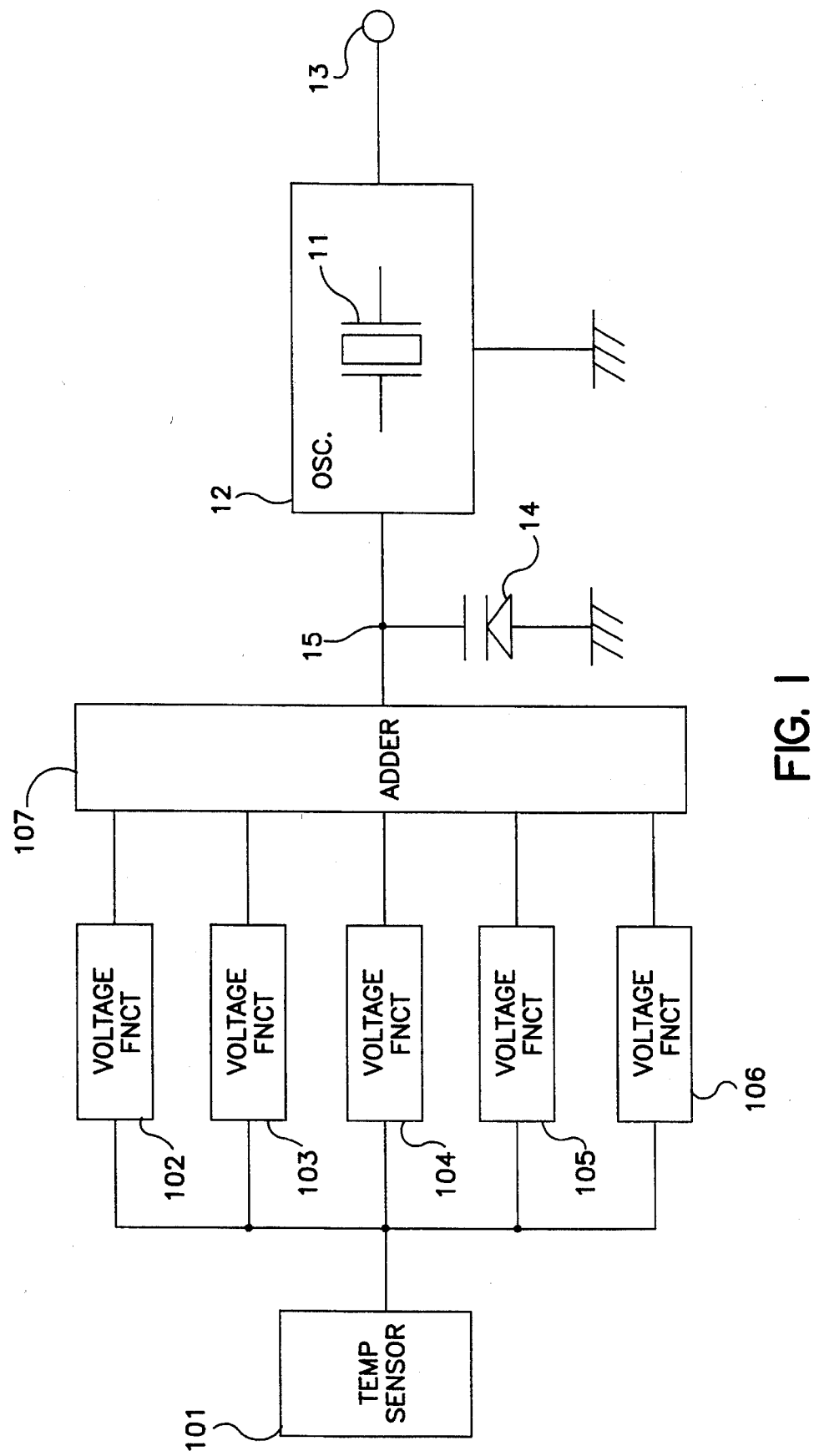
FIG. 1 is a block diagram showing a temperature compensated crystal oscillator according to a first example of the present invention.

FIG. 1 is a block diagram showing a temperature compensated crystal oscillator according to the first example of the present invention. As is shown in FIG. 1, the temperature compensated crystal oscillator includes a temperature sensor 101 for detecting temperature, voltage function generating circuits 102, 103, 104, 105, and 106, a voltage adder 107 for adding and outputting voltages generated by the voltage function generating circuits 102 to 106, and an oscillation circuit 12 with a quartz crystal resonator 11 for stabilizing the frequency oscillated thereby. The oscillation circuit 12 has an output terminal 13 for outputting the oscillating voltage and a control terminal 15 for controlling the oscillating frequency. A variable capacitance diode 14 whose capacitance is varied in accordance with a voltage applied thereto is connected to the control terminal 15.

The temperature sensor 101 generates a voltage which is in proportion to the detected temperature. The generated voltage is input to the voltage function generating circuits 102, 103, 104, 105, and 106. Each of the voltage function generating circuits 102 to 106 has input-output characteristics such that the output voltage thereof linearly increases as the voltage input thereto increases and that the output voltage linearly decreases after reaching a peak voltage, the increase and decrease of the output voltage occurring only in a predetermined range of input voltages. Thus, the input-output characteristics of each of the voltage function generating circuits 102 to 106 constitute a curve having a reversed V-shape. Output voltages from the voltage function generating circuits 102 to 106 are input to the voltage adder 107 so as to be added with one another. The voltage adder 107 is connected to the control terminal 15 of the oscillation circuit 12. An output voltage from the voltage adder 107 is applied to the variable capacitance diode 14 so as to stabilize the oscillating frequency against changes in temperature.

Figure 2A:
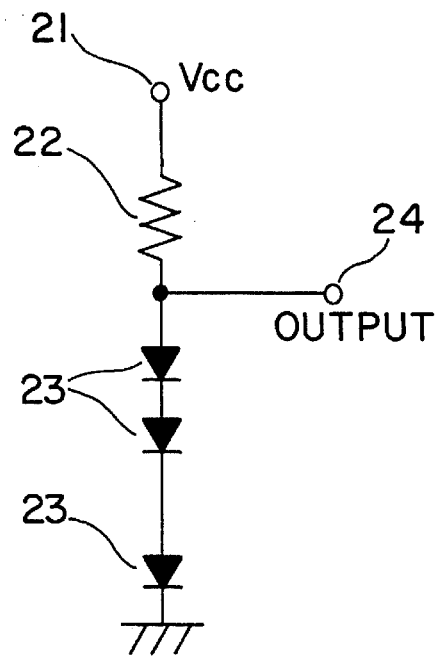
FIG. 2(a) is a circuit diagram showing a temperature sensor including diodes in a temperature compensated crystal oscillator according to one example of the present invention.
Figure 2B:
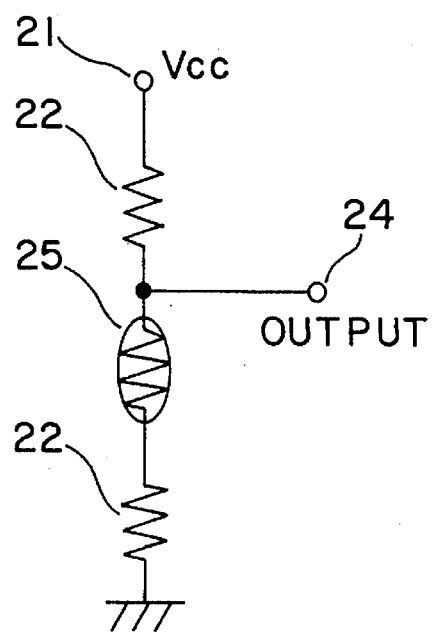
FIG. 2(b) is a circuit diagram showing a temperature sensor including thermistor in a temperature compensated crystal oscillator according to one example of the present invention.

As is shown in FIG. 2(a), the temperature sensor 101 may be a circuit in which a plurality of diodes 23 connected in series are connected in series to a resistor 22. When a DC voltage is applied to a terminal 21, a voltage shift corresponding to a change in temperature can be obtained at an output terminal 24 provided at the connection between the resistor 22 and the diodes 23, utilizing the changes in the p-n junction potential of the diodes 23 in response to changes in temperature. Alternatively, as is shown in FIG. 2(b), the temperature sensor 101 may be a circuit in which a thermistor 25 is connected in series to resistors 22, so as to utilize the changes in the resistance of the circuit in response to changes in temperature. In the temperature sensor 101 of the configuration shown in FIG. 2(b) as well, a voltage shift corresponding to a change in temperature can be obtained at the output terminal 24 by applying a DC voltage to the terminal 21.

Figure 3:
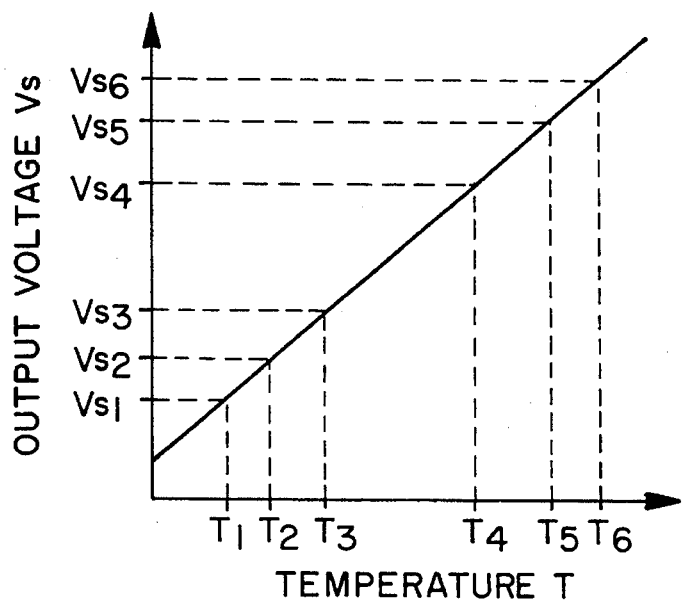
FIG. 3 is a diagram for describing the relationship between temperature and the output voltage of a temperature sensor according to one example of the present invention.

Hereinafter, operating principles for the temperature compensated crystal oscillator of the present example will be described in more detail with reference to the accompanying drawings. It is assumed that, as is shown in FIG. 3, the output voltage from the temperature sensor 101 changes substantially linearly as with changes in temperature T. It is also assumed that the temperature sensor 101 outputs voltages $V_{s1}$, $V_{s2}$, $V_{s3}$, $V_{s4}$, $V_{s5}$, and $V_{s6}$ at temperatures $T_1$, $T_2$, $T_3$, $T_4$, $T_5$, and $T_6$, respectively.

Figure 4:
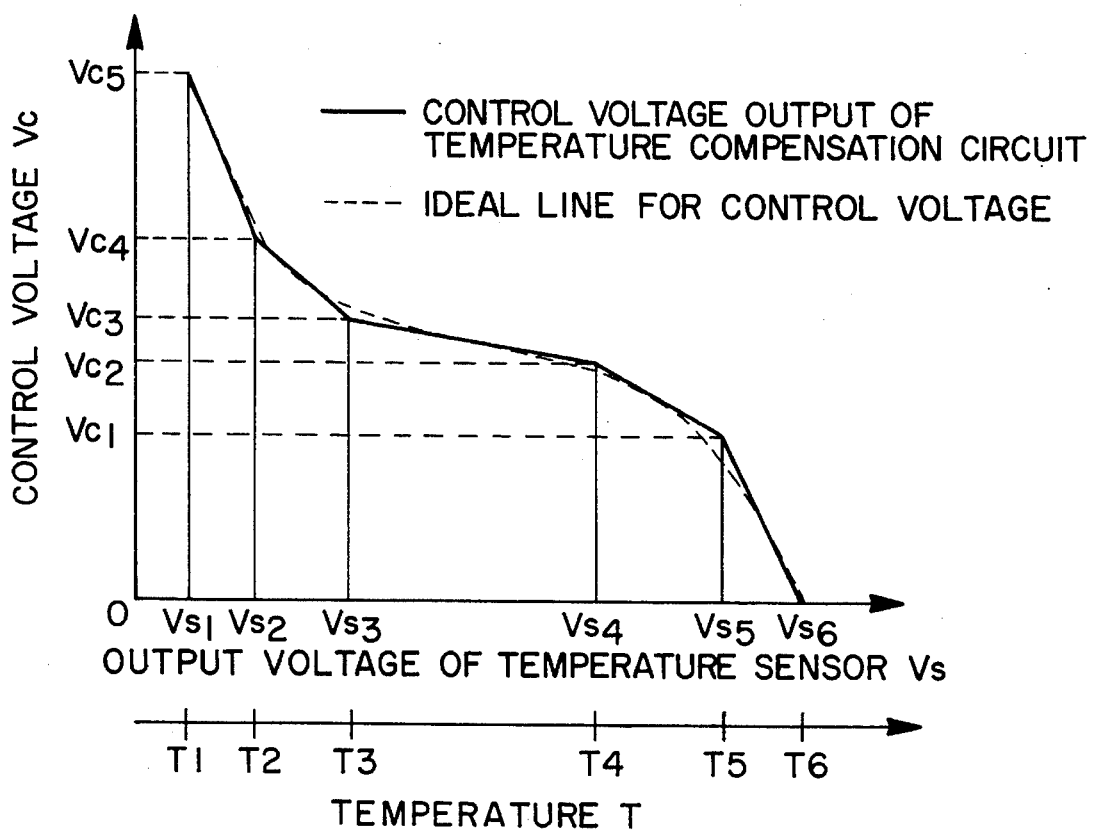
FIG. 4 shows an ideal control voltage curve (indicated by the dotted line) for ideally compensating a quartz crystal resonator therein and a control curve (indicated by the solid line) consisting of straight lines each constituting an approximation to the ideal compensation curve in one of temperature ranges.

FIG. 4 shows an ideal control voltage curve (indicated by the dotted line) for ideally compensating the temperature compensated crystal oscillator and a control curve (indicated by the solid line) consisting of straight lines which approximate to the ideal control voltage curve as a whole. If the control voltage $V_c$ is applied to the control terminal 15 (shown in FIG. 1) based on the ideal control voltage curve, the fluctuation of the oscillating frequency oscillated by the temperature compensated crystal oscillator can be perfectly compensated in the temperature range of $T_1$ to $T_6$. The control voltage $V_c$ to be actually applied to the control terminal 15 has a characteristic curve consisting of five straight lines and constituting an approximation to the ideal control voltage curve. Each of the five straight lines corresponds to one of the five divided temperature ranges, i.e., $T_1$ to $T_2$, $T_2$ to $T_3$, $T_3$ to $T_4$, $T_4$ to $T_5$, and $T_5$ to $T_6$.

One major feature of the temperature compensation method of the present invention is its use of a plurality of straight lines constituting an approximation to the ideal control voltage curve which keeps the fluctuation of the oscillating frequency zero, each of the straight lines being made optimum for one of the prescribed temperature ranges. On the other hand, a conventional temperature compensation method characteristically uses straight lines as an approximation to a curve representing the relationship between temperature and the oscillating frequency of a quartz crystal resonator. Although both the method of the present invention and the conventional method use an approximation approach with straight lines, they are quite different from one another in their ways of conducting the approximation.

Figure 5:
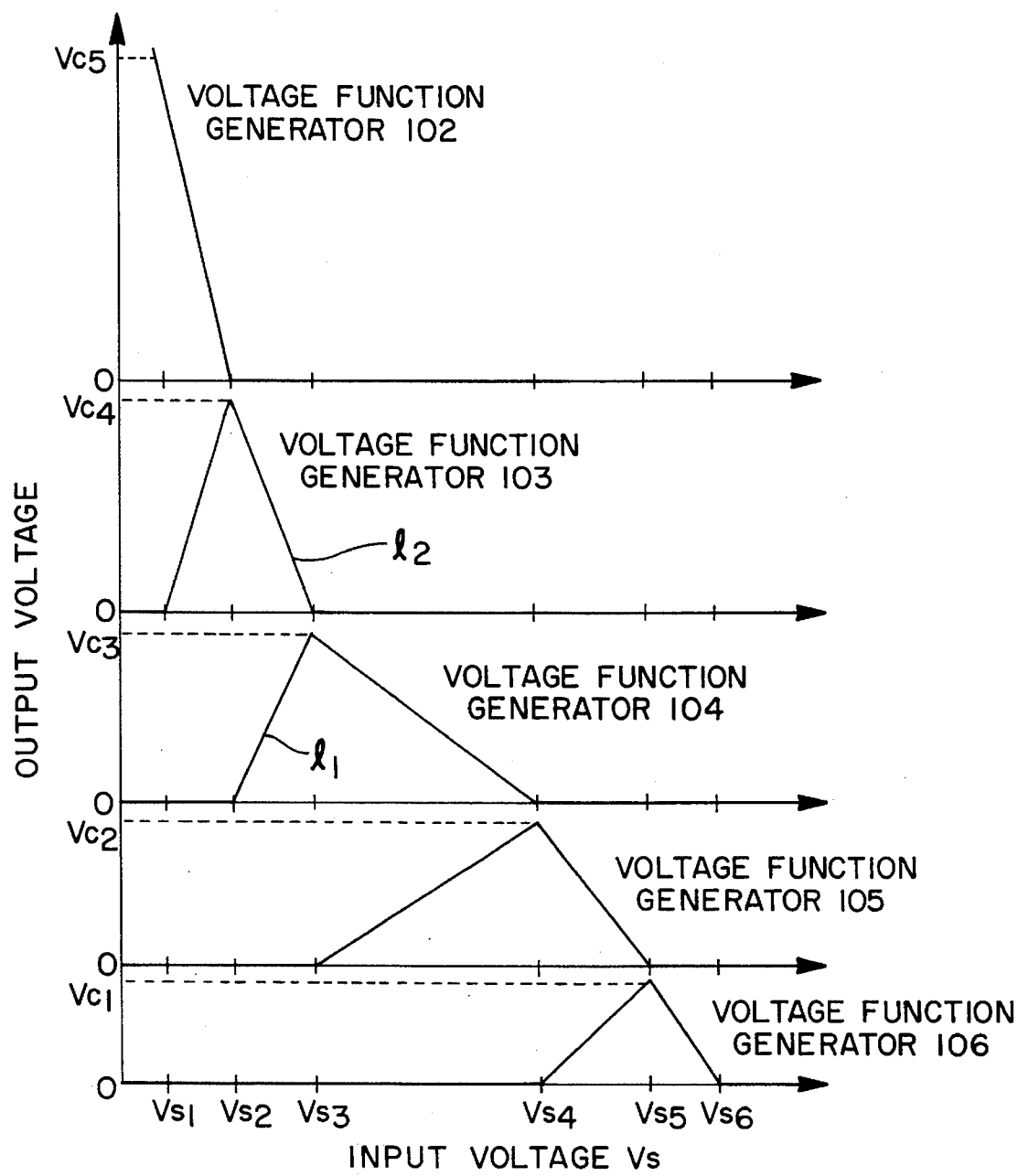
FIG. 5 is a diagram showing the input-output characteristics of the voltage function generating circuits according to the first example of the present invention.

FIG. 5 shows examples of voltages to be output from the voltage function generating circuits 102 to 106 (shown in FIG. 1) in response to the input voltage $V_s$ from the temperature sensor 101 so that the approximation curve of straight lines shown by the solid line in FIG. 4 is achieved. As is seen from FIG. 5, each of the voltage function generating circuits 103 to 106 generates the voltages having a reversed V-shaped curve only during two adjoining input voltage ranges. The output voltage from the voltage function generating circuit 102 corresponds to only one input voltage range. As is shown in FIG. 5, the voltage function generating circuit 102 operates in the input voltage range between $V_{s1}$ to $V_{s2}$; the voltage function generating circuit 103 operates in the input voltage range between $V_{s1}$ to $V_{s3}$; the voltage function generating circuit 104 operates in the input voltage range between $V_{s2}$ to $V_{s4}$; the voltage function generating circuit 105 operates in the input voltage range between $V_{s3}$ to $V_{s5}$; and the voltage function generating circuit 106 operates in the input voltage range between $V_{s4}$ to $V_{s6}$. The output voltage of each voltage function generating circuit is zero outside its corresponding input voltage range as shown above.

Moreover, the voltage function generating circuit 102 outputs a maximum voltage $V_{c5}$ at the input voltage $V_{s1}$; the voltage function generating circuit 103 outputs a maximum voltage $V_{c4}$ at the input voltage $V_{s2}$; the voltage function generating circuit 104 outputs a maximum voltage $V_{c3}$ at the input voltage $V_{s3}$; the voltage function generating circuit 105 outputs a maximum voltage $V_{c2}$ at the input voltage $V_{s4}$;

and the voltage function generating circuit 106 outputs a maximum voltage $V_{c1}$ at the input voltage $V_{s5}$. For example, the output voltage of the voltage function generating circuit 104 remains at zero until the input voltage reaches $V_{s2}$, linearly increases as the input voltage increases from $V_{s2}$, reaches the maximum value $V_{c3}$ when the input voltage is $V_{s3}$, linearly decreases as the input voltage increases up to $V_{s4}$, and becomes zero again after the input voltage exceeds $V_{s4}$.

Next, the output voltages of the voltage function generating circuits 102 to 106 having the above-mentioned input-output characteristics are added with one another by the voltage adder 107 to give the control voltage $V_c$ having a curve consisting of straight lines each approximating to the ideal control voltage curve in one of the five temperature ranges.

According to the above configuration, as is seen from FIGS. 1, 4, and 5, when the control voltage $V_c$ should be calibrated in the range of the temperature of $T_1$ to $T_3$, i.e., in the range of the input voltage of $V_{s1}$ to $V_{s3}$, the maximum value of the output voltage generated by the voltage function generating circuit 103 has only to be adjusted to the voltage $V_{c4}$ at the temperature $T_2$ (corresponding to the input voltage $V_{s2}$), since the output voltages of the voltage function generating circuits 102, 104, 105, and 106 are zero at the temperature $T_2$. Thus, the calibration of the temperature compensation is greatly facilitated according to the present invention. On the other hand, the output voltage of the voltage function generating circuit 103 is zero in the temperature range except temperature ranges from $T_1$ to $T_3$ (corresponding to the input voltages except $V_{s1}$ to $V_{s3}$). Therefore, the change in the maximum output voltage $V_{c4}$ does not affect the calibration at the other temperatures $T_1$, $T_3$, $T_4$, and $T_5$ (corresponding to the input voltages $V_{s1}$, $V_{s3}$, $V_{s4}$, and $V_{s5}$) at all. In other words, the calibration of the respective maximum output voltages $V_{c5}$, $V_{c4}$, $V_{c3}$, $V_{c2}$, and $V_{c1}$ of the voltage function generating circuits 102 to 106 should only be conducted with respect to the respective temperature ranges assigned thereto, thereby eliminating any interference between one maximum output voltage and another. In addition, since straight lines are used to approximate to the ideal control voltage curve, the calibration of the temperature compensation need only be conducted at several temperature sampling points, whereby it is made easy to realize a temperature compensated crystal oscillator capable of generating a stable frequency.

Figure 6A:
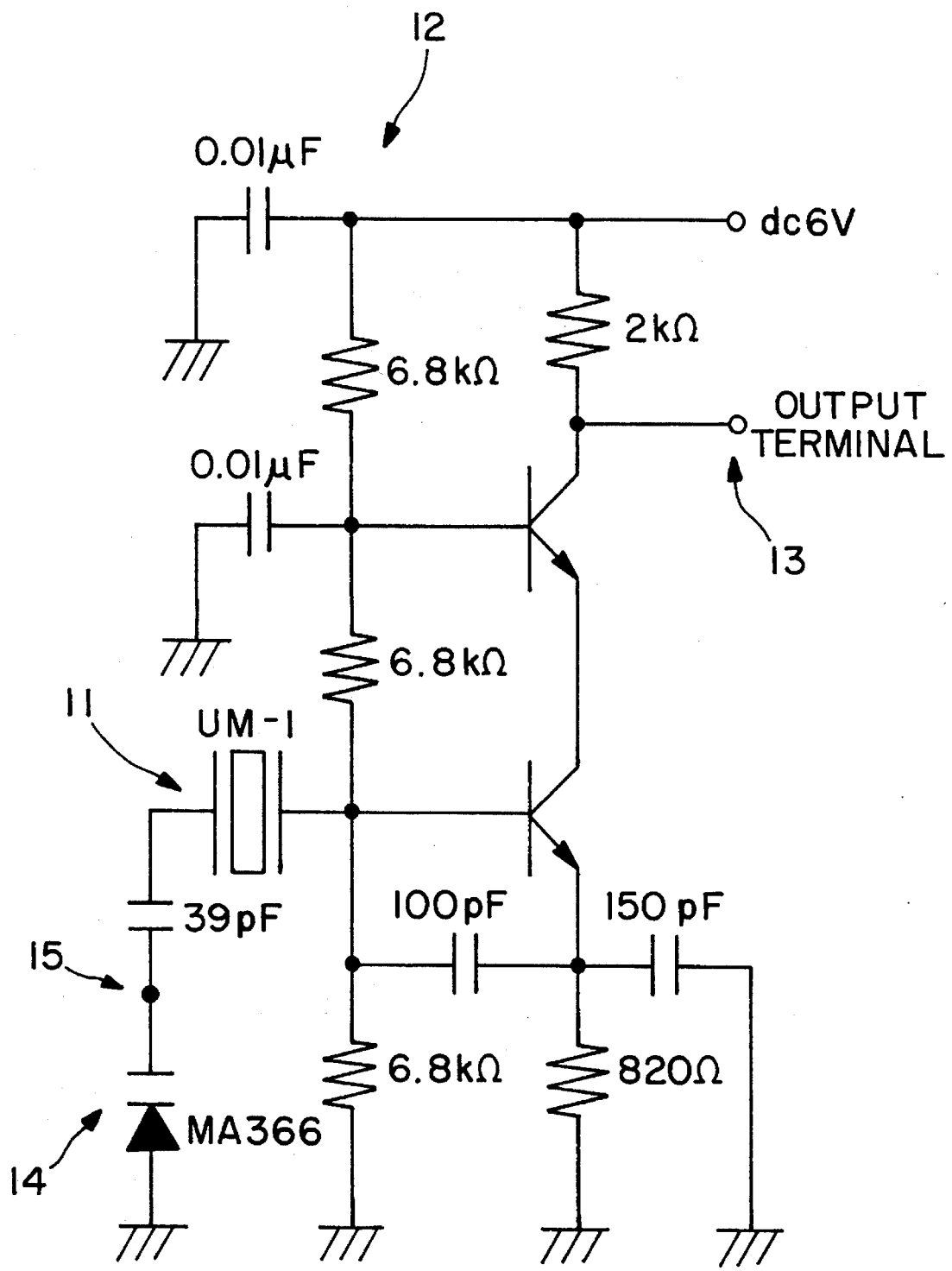
FIG. 6(a) is a part of a specific circuit diagram of the temperature compensated crystal oscillator of the first example of the present invention.
Figure 6B:
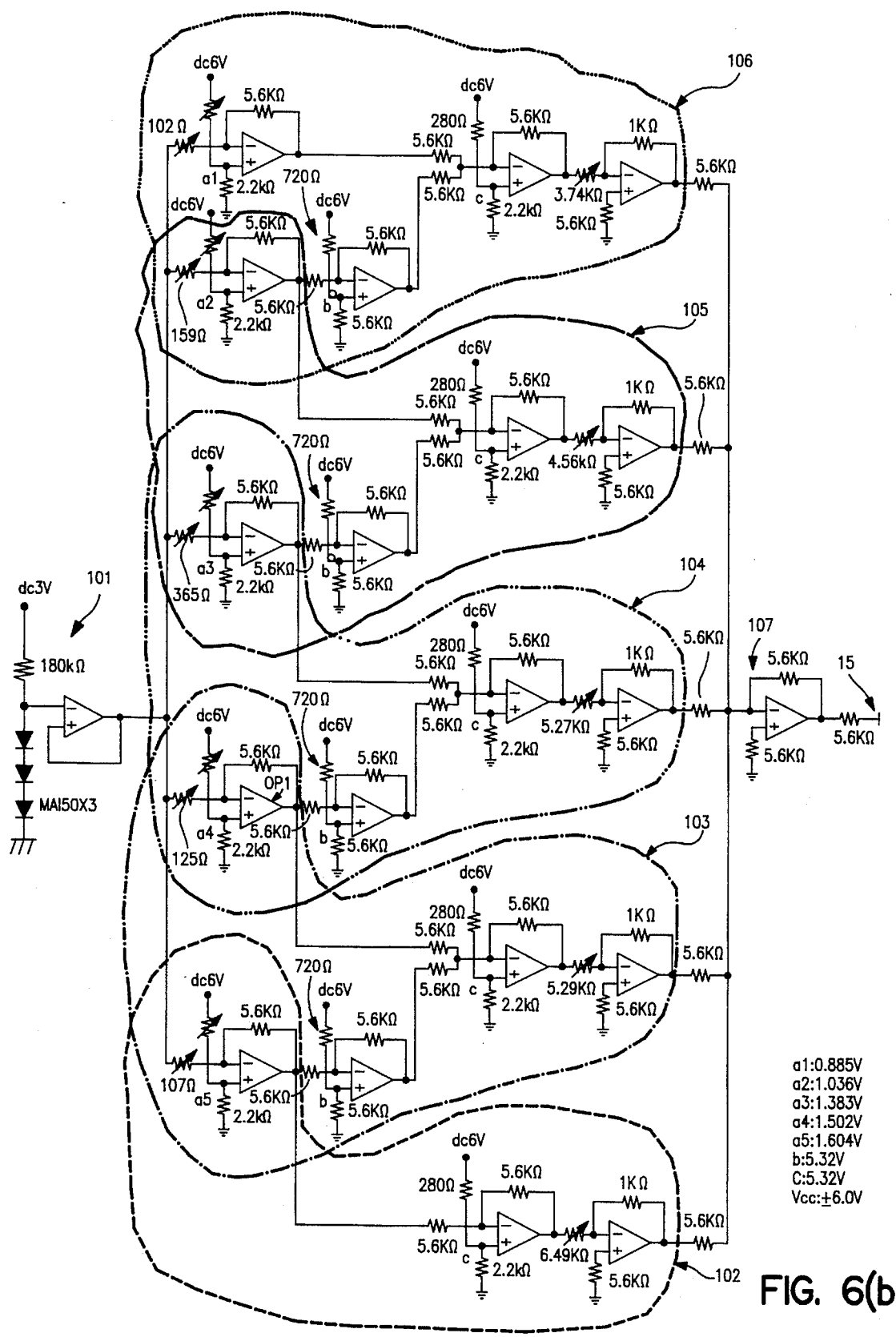
FIG. 6(b) is the other part of the specific circuit diagram of the temperature compensated crystal oscillator of the first example of the present invention.

Hereinafter, a circuit which embodies the temperature compensated crystal oscillator of the present example with operation amplifiers will be described. FIGS. 6(a) and 6(b) are diagrams showing the temperature compensated crystal oscillator of the present invention composed essentially of operational amplifiers. A circuit shown in FIG. 6(a) is connected to a circuit shown in FIG. 6(b) at the control terminal 15.

A quartz crystal resonator 11 is of a UM-1 type (frequency: 12.8 MHz), and is an AT cut crystal. An oscillation circuit 2 is a Colpitts oscillator in which silicon bipolar transistors are used. A variable capacitance diode 14 may be MA366 (manufactured by: Matsushita Electronic Components Co., Ltd.), for example. The oscillating frequency of the oscillation circuit 2 can be varied by varying the voltage applied to the variable capacitance diode 14. More specifically, the oscillating frequency of the oscillation circuit 2 increases as the applied positive voltage increases.

Figure 7:
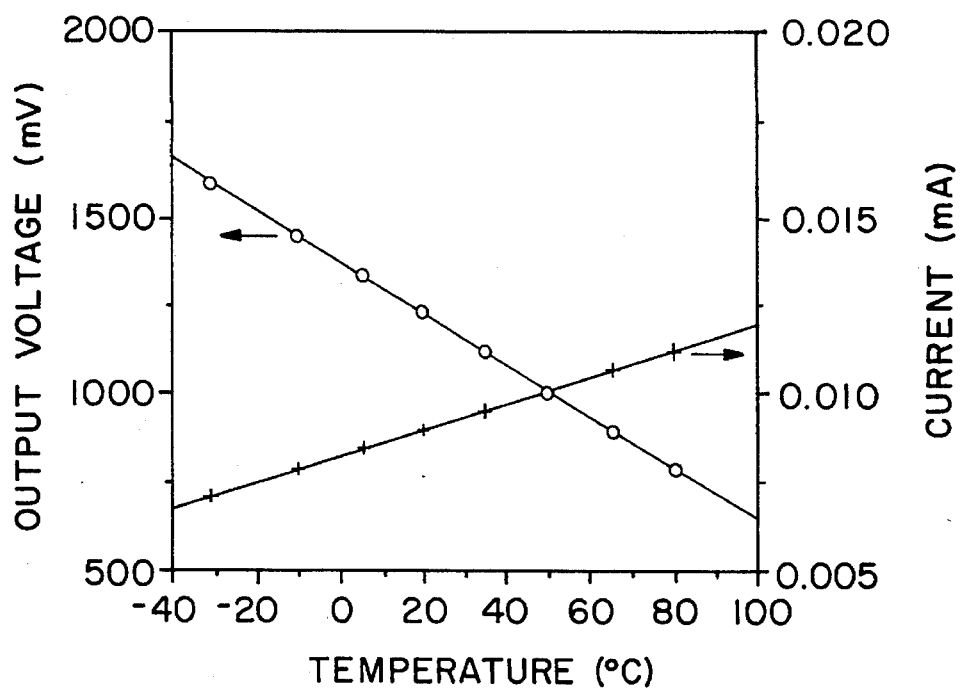
FIG. 7 is a graph showing the relationship between temperature, output voltage, and current consumption of the diode-based temperature sensor used in the circuit shown in FIGS. 6(a) and 6(b).

A temperature sensor 101 of this temperature compensated crystal oscillator is of the configuration shown in FIG. 2(a), and includes three diodes that are connected in series. Each of three diodes may be MA150 (manufactured by: Matsushita Electronic Components Co., Ltd.), for example. Since three diodes connected in series are provided, changes of temperature can cause larger changes of the output voltage from the temperature sensor than those caused by one diode, thus realizing characteristics suitable for a temperature sensor in a temperature compensated crystal oscillator. FIG. 7 is a graph showing the relationship between temperature, output voltage, and current consumption of the diode-based temperature sensor used in the circuit shown in FIG. 6(a). As is seen from FIG. 7, the output voltage of the temperature sensor has a characteristic curve linearly varying with respect to temperature.

As is shown in FIG. 6(b), voltage function generating circuits 102 to 106 and a voltage adder 107 may be realized as circuits including operational amplifiers (AN1358; manufactured by Matsushita Electronic Components Co., Ltd.). In the circuit shown in FIG. 6(b), each of the voltage function generating circuits 103 to 106 having input-output characteristics of a reversed V-shape in a predetermined input voltage range corresponding to two adjoining divided temperature ranges is constituted by the combination of a single-section voltage function generating circuits having input-output characteristics of a straight line shape in a predetermined input voltage range corresponding to a single divided temperature range. The output voltage of an $i_{th}$ single-section voltage function generating circuit (wherein i is an integer from 2 to 5) corresponding to the first half of the relevant temperature range (where the output voltage increases from zero to the maximum value) is obtained by using operational amplifiers for generating an output voltage which increases from zero to the maximum value in accordance with an input voltage varying within a predetermined range corresponding to the temperature range. The same output voltage of the $i_{th}$ single-section voltage function generating circuit is inverted to be utilized as the output voltage corresponding to the second half of the relevant temperature range (where the output voltage decreases from the maximum value to zero). For example, the voltages each consisting of one straight line denoted as $l_1$ and $l_2$ shown in FIG. 5 are generated by the operational amplifier op1 alone (shown in FIG. 6(b)).

Further, in FIG. 6(b), the voltage function generating circuit 102 is a single-section voltage function generation circuit, which is constituted by operational amplifiers for generating an output voltage which decreases from the maximum value to zero in accordance with an input voltage varying from $V_{s1}$ to $V_{s2}$ corresponding to the first temperature range. Alternatively, on the same line of principle, an $(n+1)_{th}$ (wherein n is a number of dividing points between temperature ranges; hereinafter this number will be referred to as "temperature range number") voltage function generating circuit may be a single-section voltage function generating circuit, which is constituted by operational amplifiers for generating an output voltage which increases from zero to the maximum value in accordance with an input voltage varying within a predetermined range corresponding to the $n_{th}$ temperature range, in contrast to the circuit shown in FIGS. 6(a) and 6(b). By adopting these methods, the circuits can be made somewhat simpler.

Furthermore, in the circuit shown in FIGS. 6(a) and 6(b), the maximum output voltage of each voltage function generating circuit is prescribed at the same value. Each maximum output voltage is adjusted, so as to obtain the desired overall control voltage, by adjusting the amplitude of an operational amplifier inserted between each voltage function generating circuit and the voltage adder 107. As for the maximum output voltage, it is defined by utilizing the saturation characteristics of the output voltage of operational amplifiers. Thus, it is made possible to obtain the desired control signal (voltage) curve.

Figure 8:
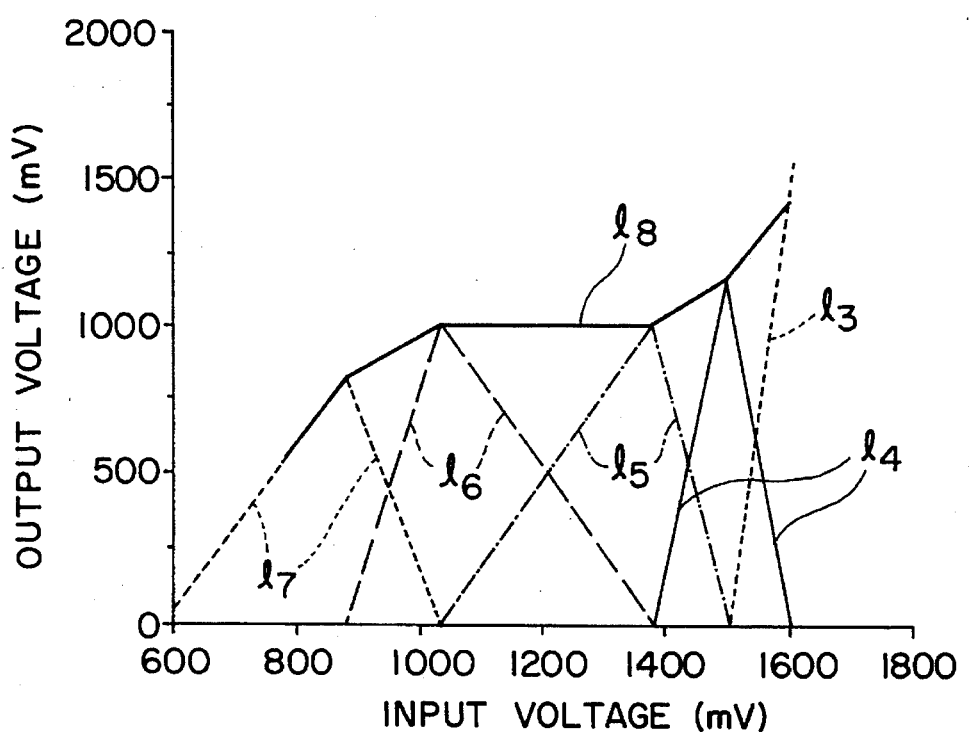
FIG. 8 is a graph showing the relationship between the input voltage and output voltage of a control signal generating means of a temperature compensated crystal oscillator composed of the circuit shown in FIGS. 6(a) and 6(b).

FIG. 8 is a graph showing the relationship between the input voltage and output voltage of the control signal generation means consisting of the voltage function generating circuits 102 to 106 and the voltage adder 107. The input voltage is generated by temperature sensor 101. Specifically, the voltage function generating circuits 102 to 106 generate output voltages $l_3$ to $l_7$, respectively, based on the input voltage. The output voltages $l_3$ to $l_7$ are totaled up by the voltage adder 107 to give an output voltage $l_8$ which is output corresponding to input voltages in the range of 800 mV to 1600 mV.

Figure 9:
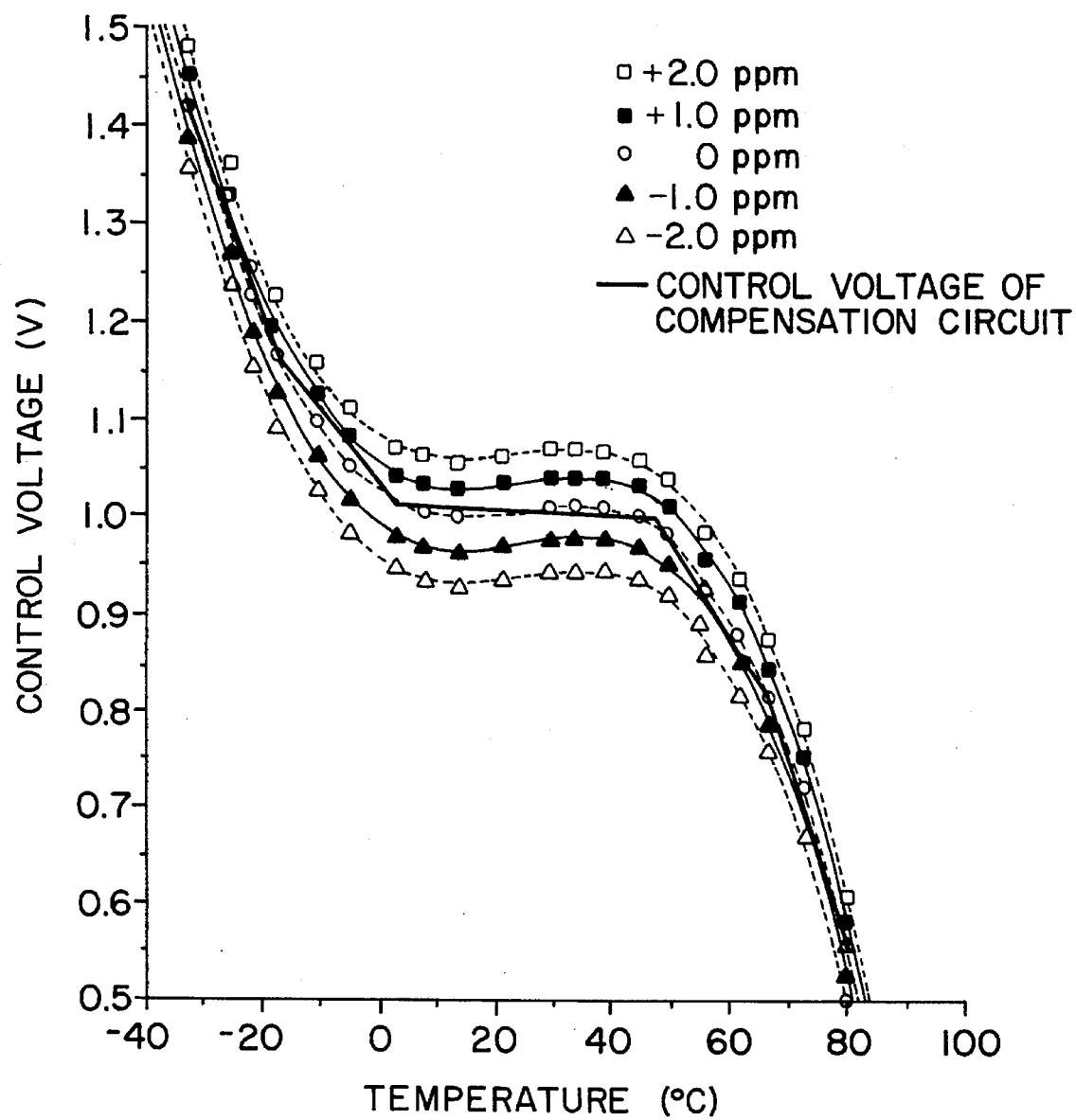
FIG. 9 is a graph showing the relationship between temperature and the control voltage of a temperature compensated crystal oscillator composed of the circuit shown in FIGS. 6(a) and 6(b), wherein 5 temperature ranges are provided.

FIG. 9 is a graph showing the relationship between temperature and the control voltage applied to the control terminal 15 of the temperature compensated crystal oscillator composed of the circuit shown in FIGS. 6(a) and 6(b). In FIG. 9, the curve indicated by circle (○) denotes an ideal temperature compensation control curve which keeps the fluctuation of the oscillating frequency zero. The curve indicated by solid squares (■) and the curve indicated by solid triangles (▲) interposing the ideal temperature compensation control curve therebetween denote control curves of the cases where the oscillating frequency fluctuates at +1 p.p.m. and −1 p.p.m., respectively. The curves located on the outside of the curves, indicated by squares (□) and triangles (△), denote control curves of the cases where the oscillating frequency fluctuates at +2 p.p.m. and −2 p.p.m., respectively.

The conspicuous, thick polygonal line denotes a control curve of the case where five temperature ranges are provided in accordance with the example explained above. The temperature scale is divided at the respective dividing points at −32° C., −17° C., 0° C., 47° C., 67° C., and 80° C., which correspond to control voltages of 1422 mV, 1167 mV, 1014 mV, 1005 mV, 819 mV, and 556 mV, respectively. The temperature ranges and the overall control curve are so prescribed as to minimize the maximum value of the frequency fluctuation, which results from the deviation of the control curve from the ideal control curve, over the whole temperature scale. The control curve thus obtained, composed of 5 approximation lines, advantageously fits within the interspace between the control lines representing ±1 p.p.m. of frequency fluctuation. This indicates that the temperature compensation can be successfully conducted with the deviation being ±1 p.p.m. or less.

Although the control curve is so prescribed as to minimize the deviation thereof over the whole temperature scale in the present example, it is also applicable to achieve approximation by prescribing that the frequency fluctuation becomes zero at both ends of each temperature range. This would somewhat increase the frequency fluctuation, but would facilitate the approximation of the ideal control curve by a plurality of straight lines and further facilitate the calibration process.

Figure 10:
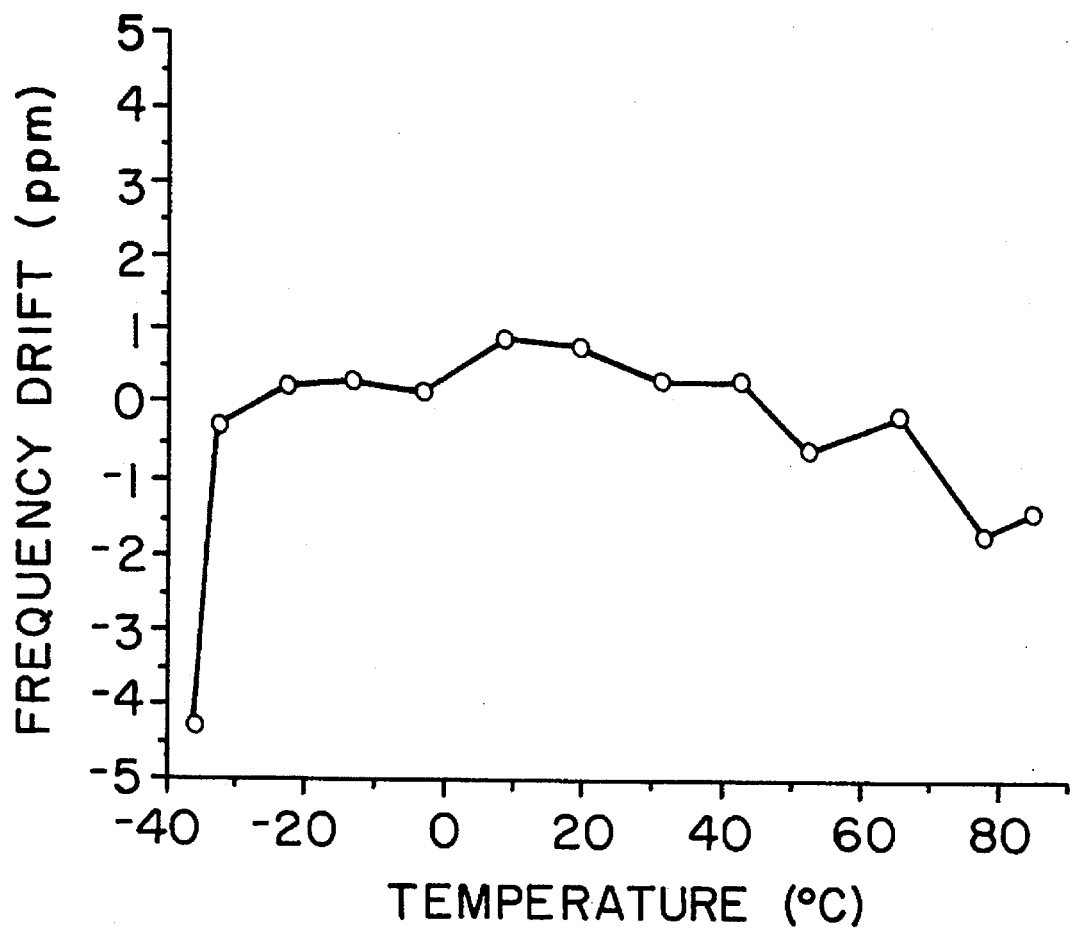
FIG. 10 is a graph showing the relationship between the frequency fluctuation and changes in temperature of a temperature compensated crystal oscillator composed of the circuit shown in FIGS. 6(a) and 6(b).

FIG. 10 is a graph showing the relationship between the frequency fluctuation and changes in temperature of the temperature compensated crystal oscillator shown in FIGS. 6(a) and 6(b). The frequency fluctuation is maintained within ±1 p.p.m. over a temperature range of −30° C. to +75° C. Although five straight lines are used to provide an approximation to the ideal control curve, each straight line corresponding to one of the temperature ranges, it generally holds that the accuracy of temperature compensation increases as there are more ranges in temperature (i.e. more straight lines being used for the approximation), and that it becomes easier to configurate the circuit as there are fewer ranges in temperature (i.e. fewer straight lines being used for the approximation). Therefore, according to the present invention, it becomes possible to realize the optimum circuit configuration in a given application by prescribing the number of temperature ranges in accordance with the target temperature zone and frequency stability. Where there are five straight lines used for the approximation, the temperature compensated crystal oscillator is most suitably used for, for example, an FDMA type large capacity analog cellular radio terminal with channel frequency intervals of 12.5 kHz or less, which requires the frequency variation to be ±1 p.p.m. or less over a temperature range of −20° C. to +85° C.

Figure 11:
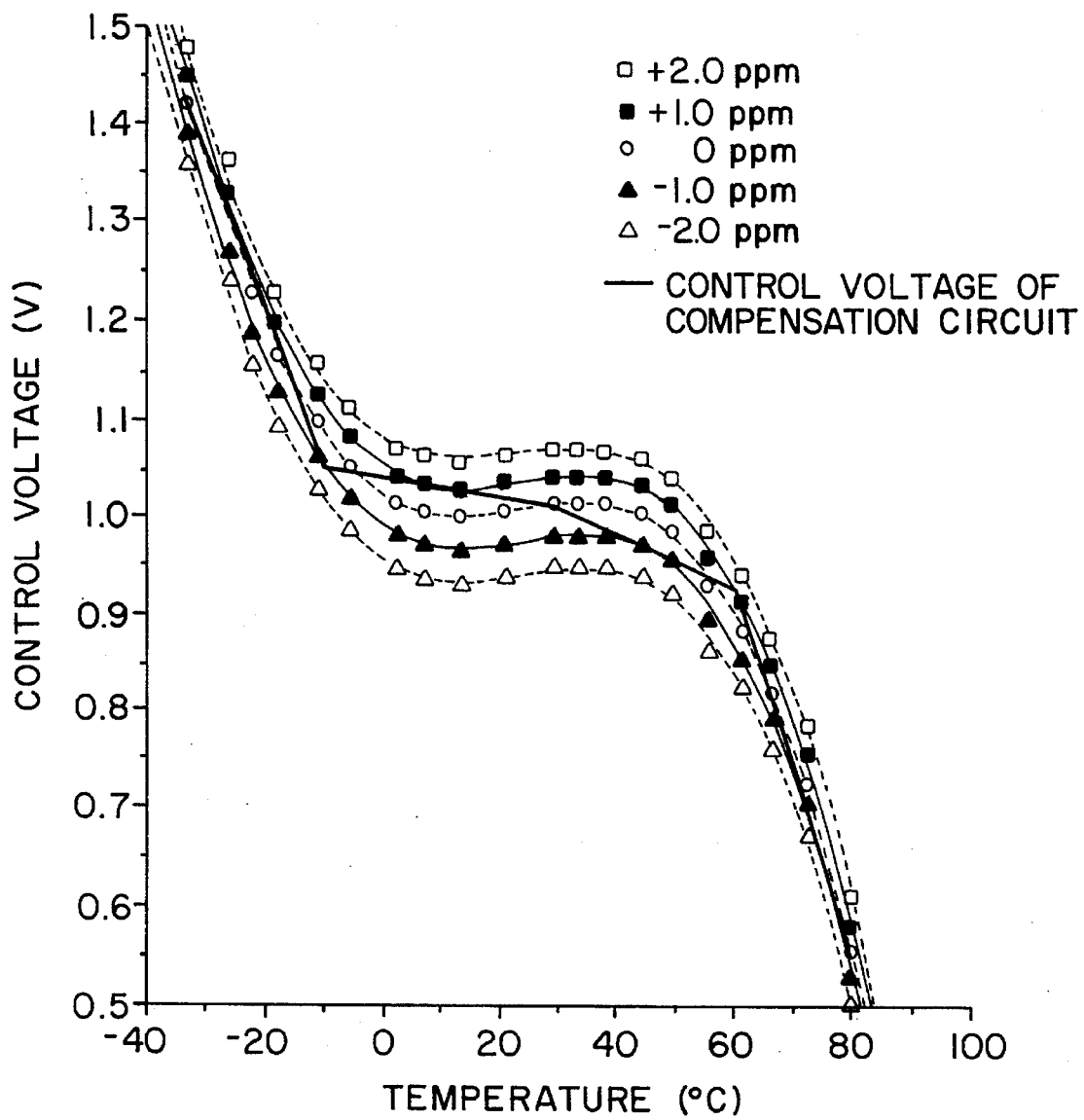
FIG. 11 is a graph showing the relationship between temperature and the control voltage of a first modified example of the temperature compensated crystal oscillator according to the first example of the present invention, wherein 4 temperature ranges are provided.

FIG. 11 is a graph showing the relationship between temperature and the control voltage of a first modified example of the temperature compensated crystal oscillator of the present example, wherein 4 temperature ranges are provided. As is seen from FIG. 11, the frequency fluctuation in response to changes in temperature is kept at ±1.5 p.p.m. or less over a temperature range of −30° C. to +75° C. This indicates that a temperature compensated crystal oscillator according to the present example in which four straight lines used for the approximation is most suitably used for, for example, a narrow-band TDMA type digital cellular radio terminal with channel frequency intervals of about 25 kHz, which requires the frequency variation to be ±1.5 p.p.m. or less over a temperature range of −20° C. to +85° C.

Figure 12:
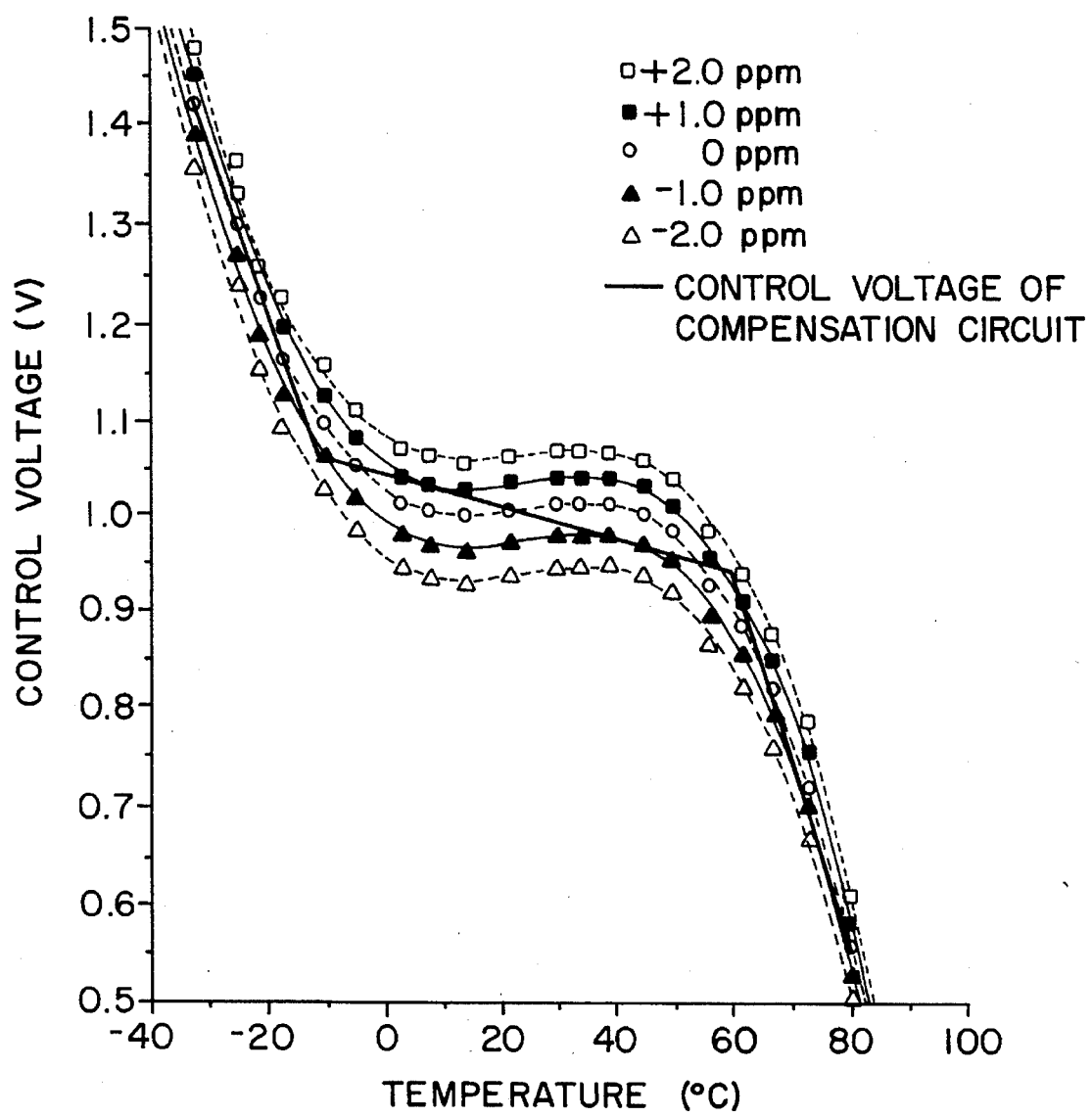
FIG. 12 is a graph showing the relationship between temperature and the control voltage of a second modified example of the temperature compensated crystal oscillator according to the first example of the present invention, wherein 3 temperature ranges are provided.

FIG. 12 is a graph showing the relationship between temperature and the control voltage of a second modified example of the temperature compensated crystal oscillator of the present example, wherein 3 temperature ranges are provided. As is seen from FIG. 12, the frequency fluctuation in response to changes in temperature is kept at ±2.5 p.p.m. or less over a temperature range of −30° C. to +75° C. This indicates that a temperature compensated crystal oscillator according to the present example in which 3 straight lines are used for the approximation is most suitably used for, for example, an FDMA type analog cellular radio terminal with channel frequency intervals of about 30 kHz or more, which requires the frequency fluctuation to be ±2.5 p.p.m. or less over a temperature range of −30° C. to +75° C. The temperature compensated crystal oscillator is also applicable to a wideband TDMA type digital cellular radio terminal and a digital cordless telephone with broad channel frequency intervals.

As has been described, according to the configuration of the present example, there is provided a compact, low-cost, and highly accurate temperature compensated crystal oscillator with facilitated temperature compensation. Therefore, according to the present example, there are provided temperature compensated crystal oscillators that are applicable to an FDMA type analog cellular radio terminal, a narrow-band TDMA type digital cellular radio terminal, a wide-band TDMA type digital cellular radio terminal, and a digital cordless telephone.

In this example, the temperature sensor 101 consists of the circuit in which a plurality of diodes or a thermistor is used. Alternatively, the temperature sensor 101 may consist of a circuit in which an electronic element other than a diode or a thermistor causes variation of an output voltage in corresponding to changes of temperature. For example, the temperature sensor 101 may consist of a circuit in which a transistor is used, and variation of a current caused by changes of temperature is converted into variation of voltage. In this case, the relationship between the current and the voltage may be a linear, second order, third order, or exponential function corresponding to input-output characteristics of an operational amplifier.

Moreover, the voltage function generating circuits 102 to 106 and/or the voltage adder 107 may includes transistors other than operational amplifiers.

Example 2

Figure 13:
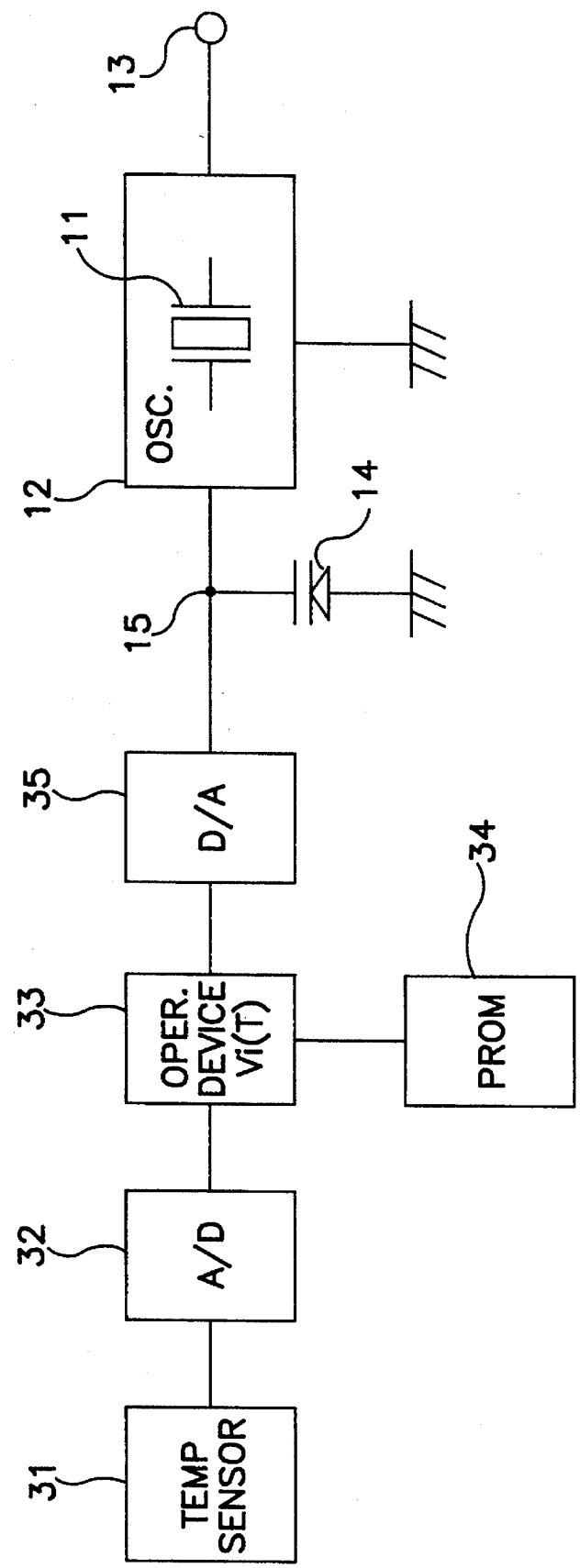
FIG. 13 is a block diagram showing a temperature compensated crystal oscillator according to a second example of the present invention.

Hereinafter, a second example of the present invention will be described with reference to the accompanying drawings. Components which correspond to those in Example 1 are indicated by the same reference numerals (unless otherwise specified). FIG. 13 is a block diagram showing a temperature compensated crystal oscillator according to the present example. As is shown in FIG. 13, the temperature compensated crystal oscillator includes a temperature sensor 31 for detecting temperature, an A/D convertor 32, an operation device 33, a PROM 34, a D/A (Digital/Analog) convertor 35, and an oscillation circuit 12 with a quartz crystal resonator 11 for stabilizing the frequency generated thereby. The oscillation circuit 12 includes an output terminal 13 for outputting the generated voltage and a control terminal 15 for controlling the oscillating frequency. A variable capacitance diode 14 whose capacitance is varied in accordance with a voltage applied thereto is connected to the control terminal 15. The oscillation circuit 12 is identical with that in Example 1.

The temperature compensated crystal oscillator of the present example is identical with that of Example 1 except that the control voltage applied to the control terminal 15 is generated by a digital operation process. The temperature sensor 31 generates a voltage which is in proportion to the detected temperature and inputs the voltage to the A/D convertor 32, where the voltage corresponding to the temperature is converted to a digital signal. The digital signal is input to the operation device 33. Temperatures $T_i$ (wherein i is an integer in the range of 1 to a temperature division number n) at dividing points between temperature ranges and control voltage values $V_{oi}$ corresponding to temperatures $T_i$ are preliminarily written in the PROM 34. These values are also input to the operation device 33, where a digital value of the control voltage V corresponding to a given temperature T is calculated out based on the following function:

$$V_i(T) = \begin{cases} 0 \ (T < T_{i-1} \text{ or } T_{i+1} < T) \\ V_{oi} \dfrac{T - T_{i-1}}{T_i - T_{i-1}} \ (T_{i-1} \leq T \leq T_i) \\ V_{oi} \dfrac{T_{i-1} - T}{T_{i+1} - T_i} \ (T_i \leq T \leq T_{i+1}) \end{cases}$$

$$V(T) = \Sigma V_i(T)$$

The digital value of the control voltage V is input to the D/A convertor 35 so as to be converted to a control voltage in the form of an analog value. An output voltage of the D/A convertor 35 is coupled to the control terminal 15 of the oscillation circuit 12 so as to stabilize the oscillating frequency with respect to temperature.

As has been described, according to the present example, the control voltage applied to the control terminal 15 is generated by a digital operation process. Therefore, the temperature compensated crystal oscillator can be realized with a configuration suitable for being integrated into ICs, thus making possible miniaturization of the oscillator. The calibration can be conducted merely by writing the dividing point temperatures and the corresponding control voltage values in the PROM 34, in which case temperatures and control voltage values can be set rather freely. This allows the control curve to be prescribed flexibly. According to this example, the temperature compensated crystal oscillator of the present invention requires compensation data consisting of a table of only 3 bits by 7 bits, for example. Therefore, it takes less time to obtain the compensation data and to write them to the PROM 34, resulting in high productivity. The temperature compensated crystal oscillator shown in FIG. 13 can consist of known analog circuits and digital circuits.

Example 3

Figure 14:
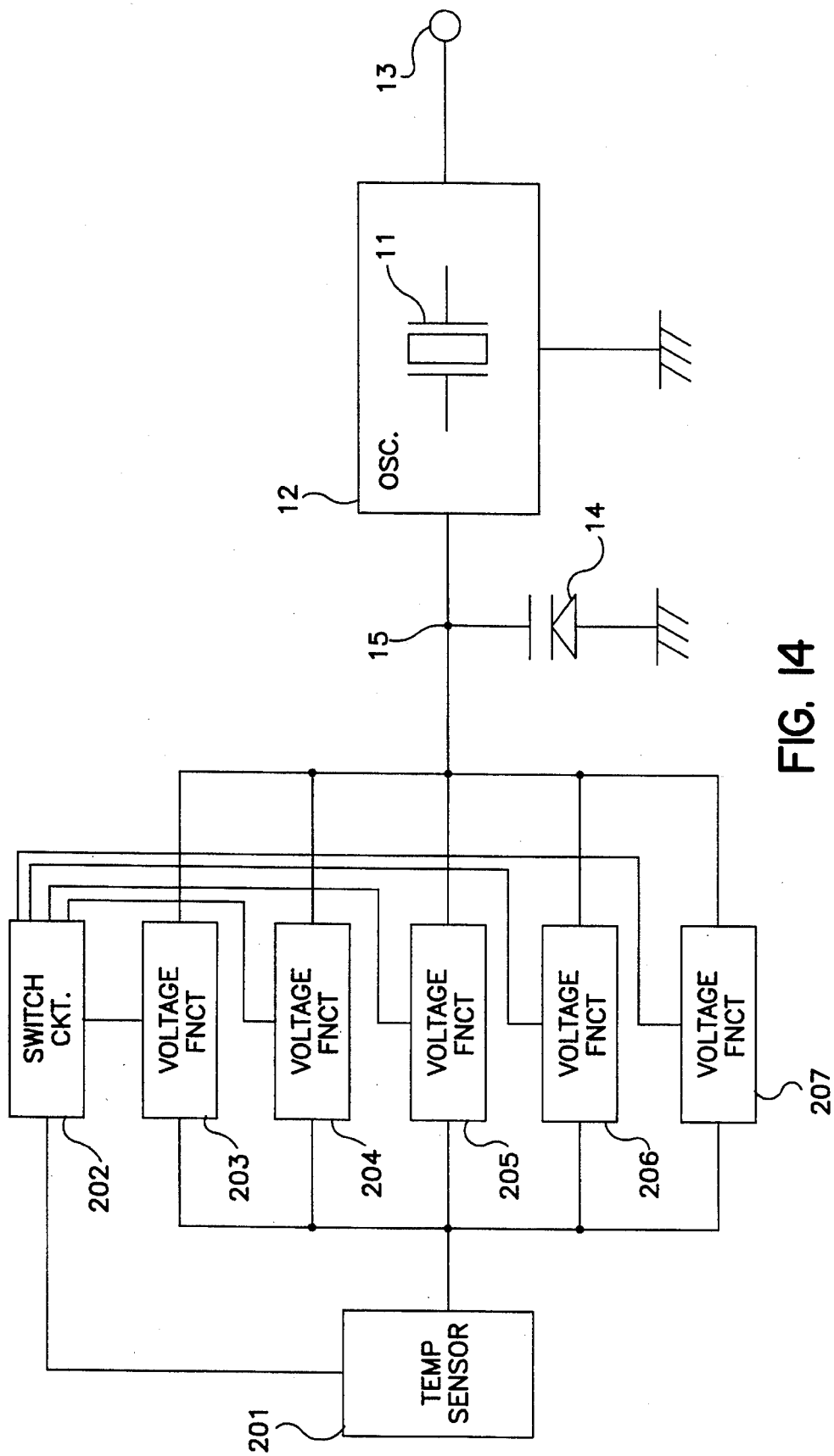
FIG. 14 is a block diagram showing a temperature compensated crystal oscillator according to a third example of the present invention.

Hereinafter, a third example of the present invention will be described with reference to the accompanying drawings. Components which correspond to those in Example 1 are indicated by the same reference numerals (unless otherwise specified). FIG. 14 is a block diagram showing a temperature compensated crystal oscillator according to the present example.

The temperature compensated crystal oscillator of the present example is identical with that of Example 1 except for the configuration of control voltage generating means. The control voltage generating means is composed of five voltage function generating circuits 203, 204, 205, 206, and 207, and a switching circuit 202 for switching between the voltage function generating circuits 203 to 207 in accordance with the output voltage from a temperature sensor 201, which is in proportion to the detected temperature.

Figure 15:
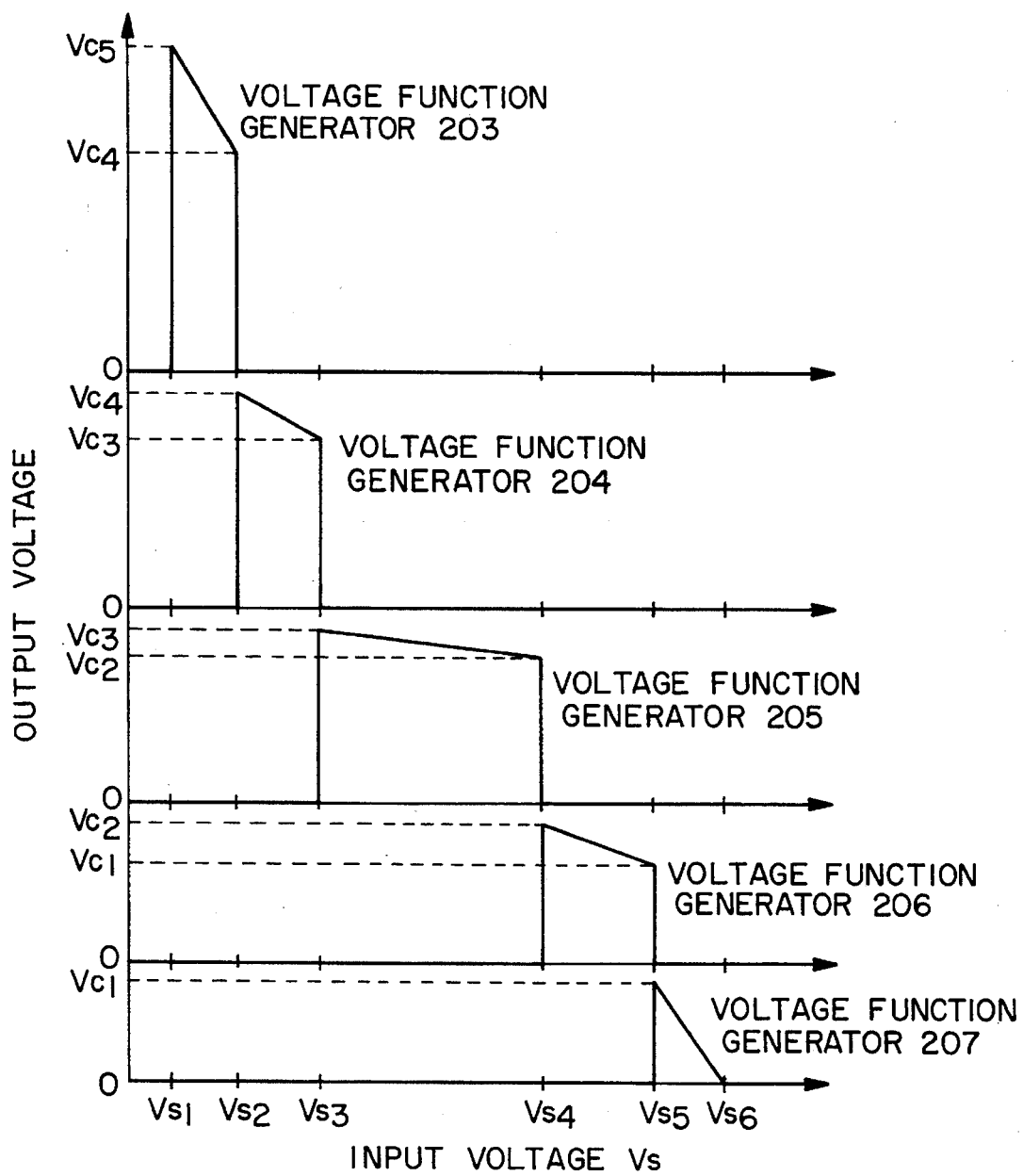
FIG. 15 is a diagram showing the input-output characteristics of the voltage function generating circuits according to the third example of the present invention.

Referring to FIGS. 14 and 15, the voltage function generating circuits 203, 204, 205, 206, and 207 generate output voltages in response to input voltages within the respective input voltage ranges $V_{s1}$ to $V_{s2}$, $V_{s2}$ to $V_{s3}$, $V_{s3}$ to $V_{s4}$, $V_{s4}$ to $V_{s5}$, and $V_{s5}$ to $V_{s6}$ from the temperature sensor 201. The output voltages of the voltage function generating circuits 203 to 207 are so adjusted as to constitute the control voltage indicated by the solid line in FIG. 15, and are prescribed at zero outside their corresponding input voltage ranges.

Hereinafter, operating principles for the temperature compensated crystal oscillator of the present example will be described. It is assumed that the temperature sensor 201 has characteristics such that the output voltage $V_s$ from the temperature sensor 201 changes substantially linearly as with changes in the ambient temperature T, as is shown in FIG. 3. It is also assumed that the temperature sensor 201 outputs voltages $V_{s1}$, $V_{s2}$, $V_{s3}$, $V_{s4}$, $V_{s5}$, and $V_{s6}$ at temperatures $T_1$, $T_2$, $T_3$, $T_4$, $T_5$, and $T_6$, respectively. It is also assumed that the relationship between the output voltage $V_s$ of the temperature sensor 201 and the control voltage $V_c$ for stabilizing the oscillating frequency is the same as that shown in FIG. 4. As is shown in FIG. 14, the output voltage of the temperature sensor 201 is also fed to the switching circuit 202 for switching between the voltage function generating circuits 203 to 207. Control lines interconnect the switching circuit 202 with the voltage function generating circuits 203 to 207 so that the switching can be conducted.

FIG. 15 also shows the operation characteristics of the switching circuit 202 and the voltage function generating circuits 203 to 207 with respect to the input voltage $V_s$ from the temperature sensor 201 which can realize the characteristics indicated by the solid line in FIG. 4. The switching circuit 202 serves to assign one of the voltage function generating circuits 203 to 207 for each input voltage range. As is shown in FIG. 15, the voltage function generating circuit 203 operates in the input voltage range of $V_{s1}$ to $V_{s2}$; the voltage function generating circuit 204 operates in the input voltage range of $V_{s2}$ to $V_{s3}$; the voltage function generating circuit 205 operates in the input voltage range of $V_{s3}$ to $V_{s4}$; the voltage function generating circuit 206 operates in the input voltage range of $V_{s4}$ to $V_{s5}$; and the voltage function generating circuit 207 operates in the input voltage range of $V_{s5}$ to $V_{s6}$. Each voltage function generating circuit is at rest (i.e. the output voltage of each voltage function generating circuit is zero) outside its corresponding input voltage range as shown above.

Moreover, each voltage function generating circuit has input-output characteristics such that the output voltage thereof linearly decreases as the input voltage increases within the corresponding input voltage range. More specifically, the output voltage of the voltage function generating circuit 203 decreases from $V_{c5}$ to $V_{c4}$ as the input voltage increases from $V_{s1}$ to $V_{s2}$; the output voltage of the voltage function generating circuit 204 decreases from $V_{c4}$ to $V_{c3}$ as the input voltage increases from $V_{s2}$ to $V_{s3}$; the output voltage of the voltage function generating circuit 205 decreases from $V_{c3}$ to $V_{c2}$ as the input voltage increases from $V_{s3}$ to $V_{s4}$; the output voltage of the voltage function generating circuit 206 decreases from $V_{c2}$ to $V_{c1}$ as the input voltage increases from $V_{s4}$ to $V_{s5}$; and the output voltage of the voltage function generating circuit 207 decreases from $V_{c1}$ to zero as the input voltage increases from $V_{s5}$ to $V_{s6}$.

By switching between the output voltages of the voltage function generating circuits 203 to 207 having the above-described characteristics with the use of the temperature sensor 201 and in accordance with the output voltage from the switching circuit 202, it becomes possible to obtain a control voltage $V_c$ having the characteristics indicated by the solid line in FIG. 4 with respect to the input voltage, that is, with respect to the ambient temperature.

According to the above-mentioned configuration, as in the case of Example 1 and as is seen from FIGS. 4, 14, and 15, the calibration of the control voltage $V_c$ at the temperature $T_2$ (corresponding to the input voltage $V_{s2}$), for example, is conducted merely by varying the maximum value $V_{c4}$ of the output voltage of the voltage function generating circuit 204 and by adjusting the output voltage of the voltage function generating circuit 203 at the temperature $T_2$, since the output voltages of the voltage function generating circuits 205, 206, and 207 are zero. Thus, the calibration of the temperature compensation is greatly facilitated. In addition, since straight lines are used to approximate the ideal compensation curve, the calibration need only be conducted at several temperature sampling points, whereby it is made easy to realize a temperature compensated crystal oscillator capable of generating a stable frequency.

Moreover, switching between the voltage function generating circuits 203, 204, 205, 206, and 207 is realized by means of the switching circuit 202. In other words, no more than one voltage function generating circuit is in operation at a time, thereby decreasing the current consumption.

The voltage function generating circuits 203 to 207 can be realized by using the operational amplifiers as those described in Example 1, based on the known art. The switching circuit 202 can be realized by using FETs (Field Effect Transistors) based on the known art.

Example 4

Figure 16:
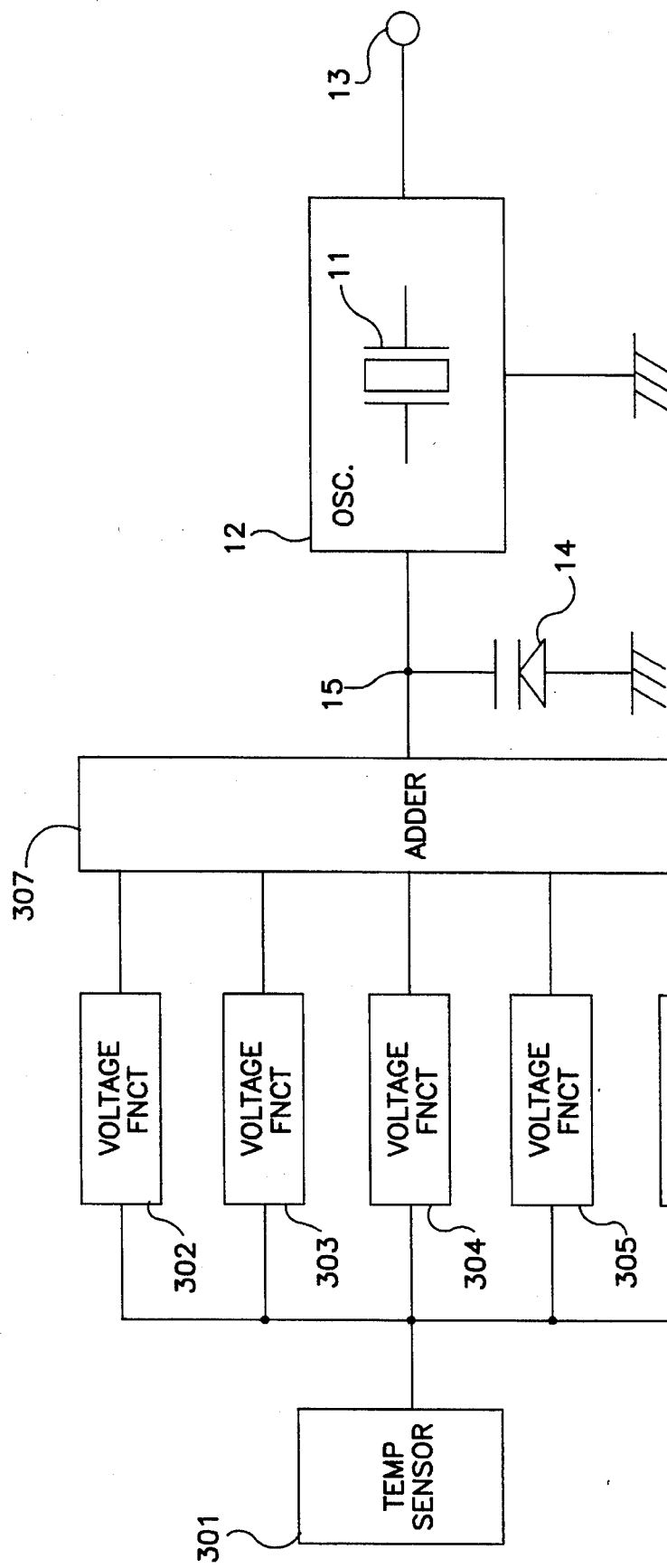
FIG. 16 is a block diagram showing a temperature compensated crystal oscillator according to a fourth example of the present invention.

Hereinafter, a fourth example of the present invention will be described with reference to the accompanying drawings. Components which correspond to those in Example 1 are indicated by the same reference numerals (unless otherwise specified). FIG. 16 is a block diagram showing a temperature compensated crystal oscillator according to the present example, which is basically identical with the temperature compensated crystal oscillator of Example 1 except for the input-output characteristics of each voltage function generating circuit.

As is shown in FIG. 16, a temperature sensor 301 is connected to the voltage function generating circuits 302, 303, 304, 305, and 306. The voltage function generating circuits 302, 303, 304, 305, and 306 in turn are connected to a voltage adder 307. The voltage adder 307 is connected to a control terminal 15 of an oscillation circuit 12 and a variable capacitance diode 14.

Hereinafter, operating principles for the temperature compensated crystal oscillator of the present example will be described. It is assumed that the temperature sensor 301 has characteristics such that the output voltage $V_s$ from the temperature sensor 301 changes substantially linearly as with changes in the ambient temperature T, as is shown in FIG. 3. It is also assumed that the temperature sensor 301 outputs voltages $V_{s1}$, $V_{s2}$, $V_{s3}$, $V_{s4}$, $V_{s5}$, and $V_{s6}$ at temperatures $T_1$, $T_2$, $T_3$, $T_4$, $T_5$, and $T_6$, respectively. It is also assumed that the relationship between the output voltage $V_s$ of the temperature sensor 301 and the control voltage $V_c$ for stabilizing the oscillating frequency is the same as that shown in FIG. 4.

Figure 17:
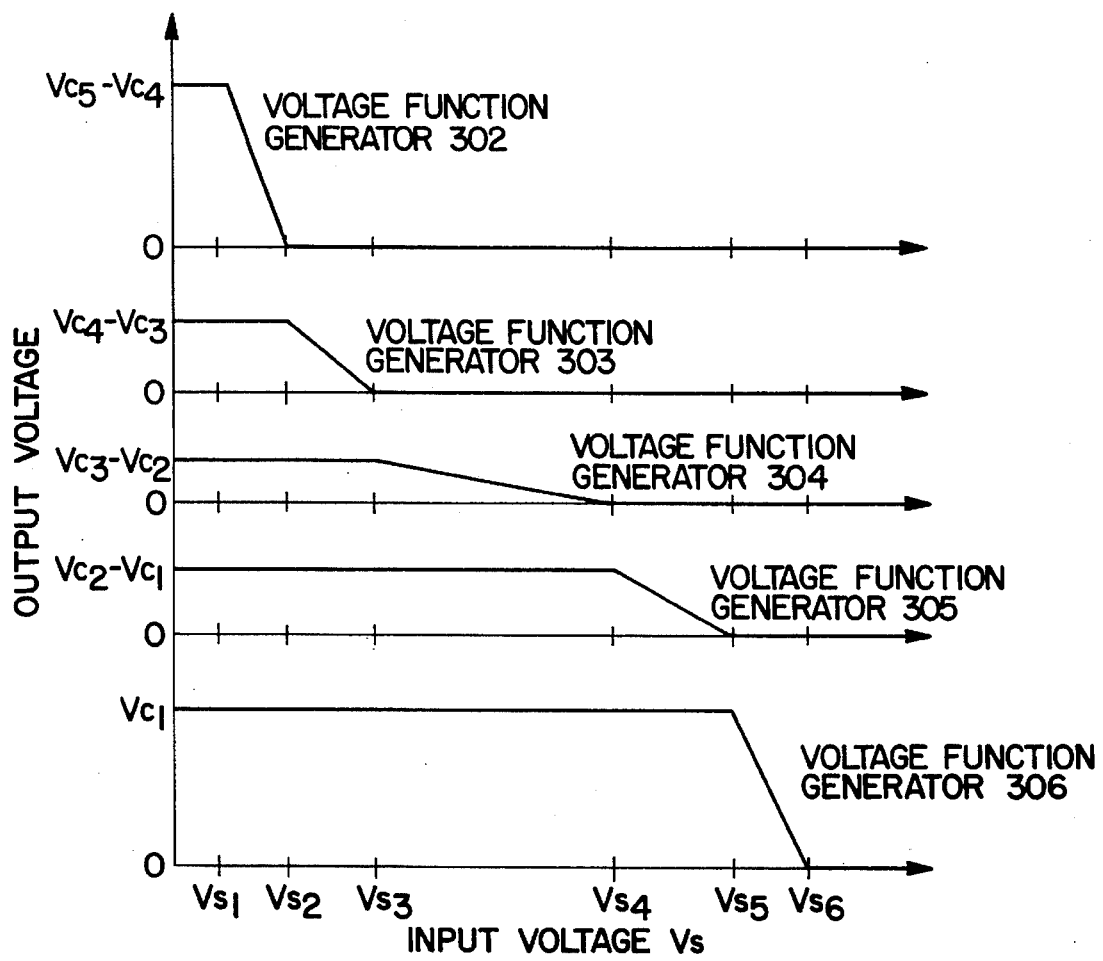
FIG. 17 is a diagram showing the input-output characteristics of voltage function generating circuits according to the fourth example of the present invention.
Figure 19:
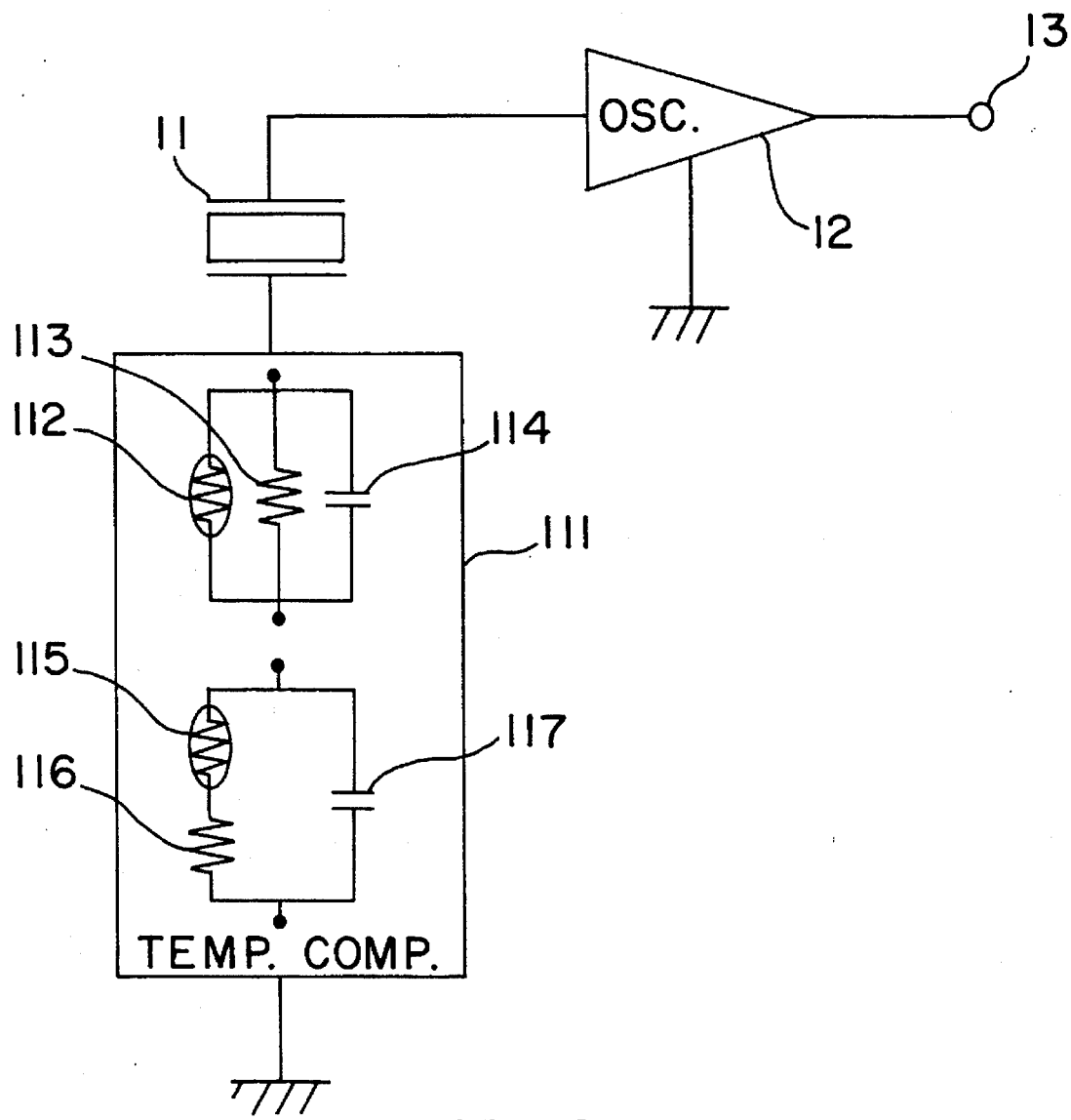
FIG. 19 is a block diagram showing a conventional analog-type temperature compensated crystal oscillator.
Figure 20:
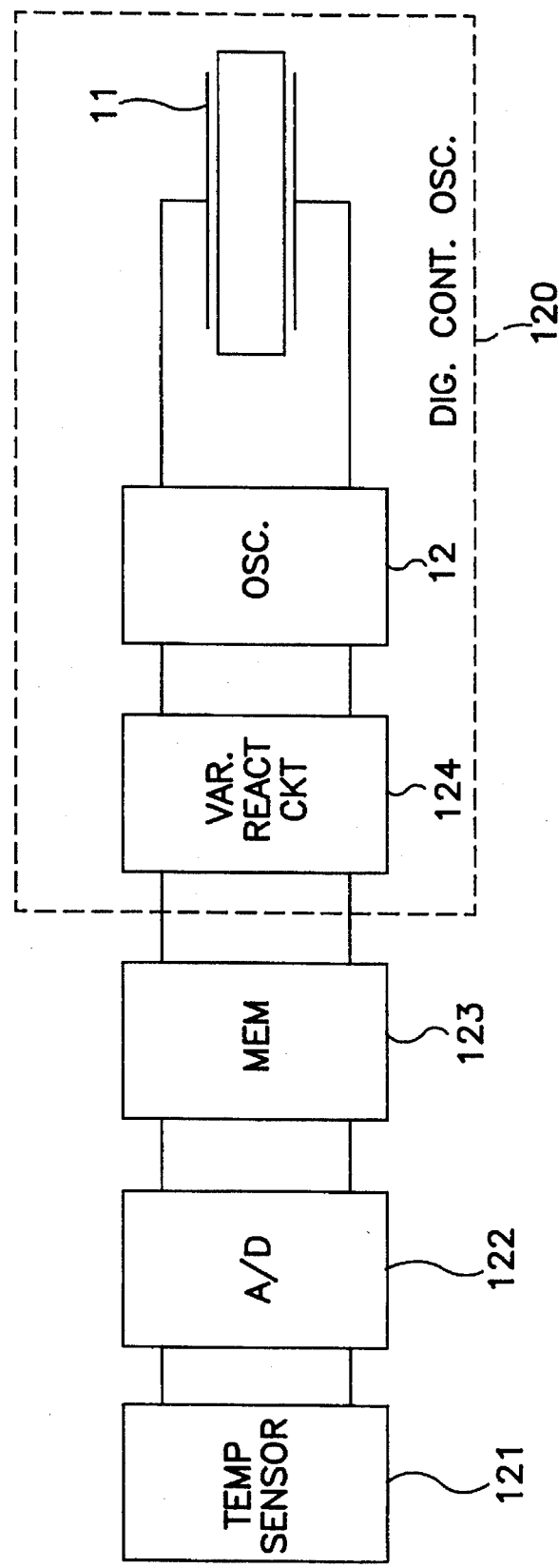
FIG. 20 is a block diagram showing a conventional digital-type temperature compensated crystal oscillator.

FIG. 17 shows the operation characteristics of the voltage function generating circuits 302 to 306 with respect to the input voltage $V_s$ from the temperature sensor 301 which can realize the characteristics indicated by the solid line in FIG. 4.

The input-output characteristics of the voltage function generating circuits 302 to 306 are as follows: The output voltage of the voltage function generating circuit 302 is maintained at the same value of $(V_{c5}-V_{c4})$ until the input voltage reaches $V_{s1}$, linearly decreases from $(V_{c5}-V_{c4})$ down to zero as the input voltage increases from $V_{s1}$ to $V_{s2}$, and is maintained at zero after the input voltage exceeds $V_{s2}$. The output voltage of the voltage function generating circuit 303 is maintained at the same value of $(V_{c4}-V_{c3})$ until the input voltage reaches $V_{s2}$, linearly decreases from $(V_{c4}-V_{c3})$ down to zero as the input voltage increases from $V_{s2}$ to $V_{s3}$, and is maintained at zero after the input voltage exceeds $V_{s3}$. The output voltage of the voltage function generating circuit 304 is maintained at the same value of $(V_{c3}-V_{c2})$ until the input voltage reaches $V_{s3}$, linearly decreases from $(V_{c3}-V_{c2})$ down to zero as the input voltage increases from $V_{s3}$ to $V_{s4}$, and is maintained at zero after the input voltage exceeds $V_{s4}$. The output voltage of the voltage function generating circuit 305 is maintained at the same value of $(V_{c2}-V_{c1})$ until the input voltage reaches $V_{s4}$, linearly decreases from $(V_{c2}-V_{c1})$ down to zero as the input voltage increases from $V_{s4}$ to $V_{s5}$, and is maintained at zero after the input voltage exceeds $V_{s5}$. The output voltage of the voltage function generating circuit 306 is maintained at $V_{c1}$ until the input voltage reaches $V_{s5}$, linearly decreases from $V_{c1}$ down to zero as the input voltage increases from $V_{s5}$ to $V_{s6}$, and is maintained at zero after the input voltage exceeds $V_{s6}$. FIGS. 18(a) and 18(b) show one example of a specific circuit to obtain the input-output characteristics of the voltage function generating circuits 302 to 306 shown in FIG. 17.

Next, the output voltages of the voltage function generating circuits 302 to 306 having the above-mentioned input-output characteristics are added with one another by the voltage adder 307 to give the control voltage $V_c$ having the characteristics indicated by the solid line in FIG. 4 with respect to the input voltage from the temperature sensor 301, that is, with respect to the ambient temperature.

According to the above configuration, as is seen from FIGS. 4, 16, and 17, the calibration of the control voltage $V_c$ in the temperature range of $T_2$ to $T_3$, for example, (corresponding to the input voltage range of $V_{s2}$ to $V_{s3}$) is conducted merely by varying the value $(V_{c4}-V_{c3})$ of the output voltage of the voltage function generating circuit 303. The reason is that, since the output voltages of the voltage function generating circuits 302, 304, 305, and 306 are constant values, the control voltage can be adjusted merely by adjusting the voltage function generating circuit 303. Thus, the temperature compensation is greatly facilitated according to the present example.

When the temperature-frequency characteristics must be adjusted with respect to all temperature ranges, the calibration is conducted from the voltage function generating circuits 306, 305, 304, 303, to 302. Since straight lines are used to approximate to the ideal compensation curve, the temperature compensation need only be conducted at several temperature sampling points, whereby it is made easy to realize a temperature compensated crystal oscillator capable of generating a stable frequency. In addition, the temperature compensated crystal oscillator shown in FIG. 16 has the advantage that the voltage function generating circuits 302 to 306 can be made simpler than the voltage function generating circuits 102 to 106 in Example 1.

Some exemplary values for temperatures and voltages, and some exemplary parts numbers for electronic elements are mentioned above. It will be appreciated that other values and parts numbers which will enable operation of the invention described also may be used. Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A temperature compensated crystal oscillator comprising:

oscillation means including a quartz crystal resonator and a control terminal, for providing an oscillating signal determined by the quartz crystal resonator and a control signal, the control signal being applied to the control terminal;

temperature detecting means for detecting an operation temperature and outputting a temperature signal based on the operation temperature; and control signal generating means for receiving the temperature signal from the temperature detecting means, generating the control signal based on a characteristic curve, and outputting the control signal to the control terminal; the characteristic curve essentially consisting of a plurality of straight lines and being an approximation of an ideal control curve in a predetermined operation temperature range including the operation temperature, the ideal control curve having a relationship between the control signal and the temperature signal for ideally compensating a fluctuation of a frequency of the oscillating signal against changes of the operation temperature, the predetermined operation temperature range being divided into temperature ranges, each of the plurality of straight lines corresponding to a respectively different one of the divided temperature ranges, wherein the control signal generating means includes a plurality of voltage function generating circuits each having input-output characteristics for linearly varying their respective output voltages from a first predetermined voltage to a second predetermined voltage in accordance with an input voltage within an input voltage range corresponding to a predetermined one of the divided temperature ranges and for maintaining their respective output voltages at either the first predetermined voltage or the second predetermined voltage in an input voltage range corresponding to divided temperature ranges other than the one predetermined divided temperature range; and a voltage adder for adding the respective output voltages of all the voltage function generating circuits with one another.

2. A temperature compensated crystal oscillator according to claim 1, wherein the characteristic curve is selected so as to minimize a maximum value of frequency fluctuation resulting from deviation from the ideal control curve over the predetermined operation temperature range.

3. A temperature compensated crystal oscillator according to claim 1, wherein each of the plurality of straight lines conforms to the ideal control curve at both ends of each divided temperature range so that no frequency fluctuation occurs at either end of each divided temperature range.

4. A temperature compensated crystal oscillator according to claim 1, wherein the characteristic curve consists of five straight lines.

5. A temperature compensated crystal oscillator according to claim 1, wherein the characteristic curve consists of four straight lines.

6. A temperature compensated crystal oscillator according to claim 1, wherein the characteristic curve consists of three straight lines.

7. A temperature compensated crystal oscillator according to claim 1, wherein the temperature detecting means is a circuit including a resistor connected in series to a plurality of diodes connected in series to one another, a connection point between the resistor and the diodes defining an output terminal for outputting the temperature signal, and a DC current being applied to the circuit.

8. A temperature compensated crystal oscillator, comprising:

oscillation means including a quartz crystal resonator and a control terminal, for providing an oscillating signal determined by the quartz crystal resonator and a control signal, the control signal being applied to the control terminal;

temperature detecting means for detecting an operation temperature and outputting a temperature signal based on the operation temperature; and control signal generating means for receiving the temperature signal from the temperature detecting means, generating the control signal based on a characteristic curve, and outputting the control signal to the control terminal; the characteristic curve essentially consisting of a plurality of straight lines and being an approximation of an ideal control curve in a predetermined operation temperature range including the operation temperature, the ideal control curve having a relationship between the control signal and the temperature signal for ideally compensating a fluctuation of a frequency of the oscillating signal against changes of the operation temperature, the predetermined operation temperature range being divided into temperature ranges, each of the plurality of straight lines corresponding to one of the divided temperature ranges;

wherein the control signal generating means includes a plurality of voltage function generating circuits each having input-output characteristics for linearly varying their respective output voltages in accordance with the temperature signal within a predetermined one of the divided temperature ranges and for maintaining their respective voltages at a first predetermined voltage in temperature ranges other than the one predetermined divided temperature range, and switching means for switching between the voltage function generating circuits, each of the voltage function generating circuits being operated in a corresponding one of the divided temperature ranges.

9. A temperature compensated crystal oscillator, comprising:

oscillation means including a quartz crystal resonator and a control terminal, for providing an oscillating signal determined by the quartz crystal resonator and a control signal, the control signal being applied to the control terminal.;

temperature detecting means for detecting an operation temperature and outputting a temperature signal based on the operation temperature; and control signal generating means for receiving the temperature signal from the temperature detecting means, generating the control signal based on a characteristic curve, and outputting the control signal to the control terminal; the characteristic curve essentially consisting of a plurality of straight lines and being an approximation of an ideal control curve in a predetermined operation temperature range including the operation temperature, the ideal control curve having a relationship between the control signal and the temperature signal for ideally compensating a fluctuation of a frequency of the oscillating signal against changes of the operation temperature, the predetermined operation temperature range being divided into temperature ranges, each of the plurality of straight lines corresponding to one of divided temperature ranges, wherein the control signal generating means includes: a number (n+1) of voltage function generating circuits having input-output characteristics such that, in a predetermined input voltage range corresponding to two adjoining ones of the divided temperature ranges, an output voltage linearly increases from zero to a predetermined maximum value in accordance with input voltage in a first one or the two adjoining temperature ranges and that the output voltage linearly decreases from the maximum value to zero in accordance with the input voltage in the other one of the two adjoining temperature ranges and further that the output voltage is zero in an input voltage range other than the input voltage range corresponding to the two adjoining temperature ranges; and a voltage adder for adding the output voltages of all the voltage function generating circuits with one another, wherein the output voltage of each voltage function generating circuit varies based on the following relationship:

as the output voltage of an $i_{th}$ voltage function generating circuit increases from zero to a maximum value, the output voltage of an $(i-1)_{th}$ voltage function generating circuit decreases from a maximum value to zero; and as the output voltage of an $i_{th}$ voltage function generating circuit decreases from a maximum value to zero, the output voltage of an $(i+1)_{th}$ voltage function generating circuit increases from zero to a maximum value, wherein n is an integer of 2 or more representing the number of temperature ranges; and i is an integer in the range of 2 to n.

10. A temperature compensated crystal oscillator according to claim 9, wherein the output voltage of the $i_{th}$ voltage function generating circuit increasing from zero to the maximum value in the first one of the two adjoining temperature ranges is generated by a single-section voltage function generating circuit composed mainly of at least one operational amplifier, and wherein the output voltage of the single-section voltage function generating circuit composed mainly of the at least one operational amplifier is inverted to be utilized as the output voltage of the $(i-1)_{th}$ voltage function generating circuit decreasing from the maximum value to zero in the other one of the two adjoining temperature ranges.

11. A temperature compensated crystal oscillator according to claim 9, wherein the first of said number of voltage function generating circuits is a single-section voltage function generating circuit composed mainly of operational amplifiers for generating output voltage decreasing from a maximum value to zero in accordance with the input voltage.

12. A temperature compensated crystal oscillator according to claim 9, wherein the $(n+1)_{th}$ voltage function generating circuit is a single-section voltage function generating circuit composed mainly of operational amplifiers for generating output voltage increasing from zero to a maximum value.

13. A temperature compensated crystal oscillator according to claim 9, wherein the predetermined maximum values of the output voltages of the voltage function generating circuits are prescribed at the same value, and wherein such a desired control signal is generated by adjusting amplitude of an operational amplifier inserted between each voltage function generating circuit and the voltage adder.

14. A temperature compensated crystal oscillator according to claim 13, wherein the voltage function generating circuits are composed mainly of at least one operational amplifier, and wherein the maximum value of the output voltage of each voltage function generating circuit is defined by utilizing saturation characteristics of an output voltage of the operational amplifier.

15. A temperature compensated crystal oscillator according to claim 8, wherein each of the plurality of straight lines conforms to the ideal control curve at both ends of each divided temperature range so that no frequency fluctuation occurs at either end of each divided temperature range.

16. A temperature compensated crystal oscillator according to claim 9, wherein the characteristic curve is selected so as to minimize a maximum value of frequency fluctuation resulting from deviation from the ideal control curve over the operation temperature range.

17. A temperature compensated crystal oscillator according to claim 9, wherein each of the plurality of straight lines conforms to the ideal control curve at both ends of each divided temperature ranges so that no frequency fluctuation occurs at both the ends.

18. A temperature compensated crystal oscillator according to claim 9, wherein the characteristic curve consists of five straight lines.

19. A temperature compensated crystal oscillator according to claim 9, wherein the characteristic curve consists of four straight lines.

20. A temperature compensated oscillator according to claim 9, wherein the characteristic curve consists of three straight lines.

21. A temperature compensated crystal oscillator according to claim 9, wherein the temperature detecting means is a circuit including a resistor connected in series to a plurality of diodes connected in series to one another, a connection point between the resistor and the diodes defining an output terminal for outputting the temperature signal, and a DC current being applied to the circuit.

* * * * *

UNITED STATES PATENT AND TRADEMARK OFFICE
CERTIFICATE OF CORRECTION

PATENT NO. : 5,473,289

DATED : December 5, 1995

INVENTOR(S) : Ishizaki, etal

It is certified that error appears in the above-identified patent and that said Letters Patent is hereby corrected as shown below: In the drawings, sheet 2, Figure 2(a) should appear as follows:

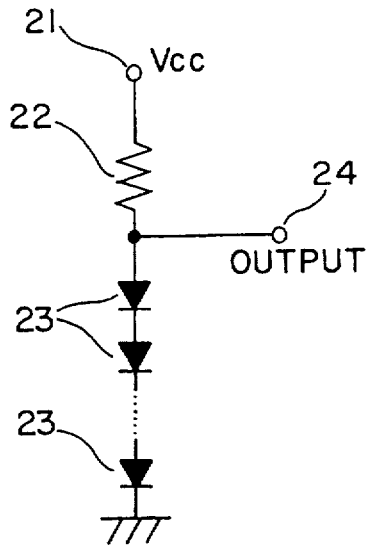

FIG. 2(a)

Signed and Sealed this

Seventh Day of May, 1996

Attest:

BRUCE LEHMAN

Attesting Officer

Commissioner of Patents and Trademarks